United States Patent
Cai et al.

(10) Patent No.: US 10,310,047 B2
(45) Date of Patent: Jun. 4, 2019

(54) SYSTEMS AND METHODS FOR FREE-BREATHING CINE DENSE MRI USING SELF-NAVIGATION

(71) Applicant: UNIVERSITY OF VIRGINIA PATENT FOUNDATION, Charlottesville, VA (US)

(72) Inventors: Xiaoying Cai, Charlottesville, VA (US); Frederick H. Epstein, Charlottesville, VA (US); Xiaodong Zhong, Marietta, GA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 217 days.

(21) Appl. No.: 15/493,825

(22) Filed: Apr. 21, 2017

(65) Prior Publication Data
US 2017/0307712 A1     Oct. 26, 2017

Related U.S. Application Data

(60) Provisional application No. 62/452,568, filed on Jan. 31, 2017, provisional application No. 62/325,754, filed on Apr. 21, 2016.

(51) Int. Cl.
*G01R 33/567* (2006.01)
*G01R 33/561* (2006.01)

(52) U.S. Cl.
CPC ....... *G01R 33/5676* (2013.01); *G01R 33/561* (2013.01)

(58) Field of Classification Search
CPC .......................... G01R 33/561; G01R 33/5676
See application file for complete search history.

(56) References Cited

U.S. PATENT DOCUMENTS

| 6,894,494 B2 * | 5/2005 | Stergiopoulos .. G01R 33/56325 324/309 |
| 7,668,585 B2 * | 2/2010 | Green ..................... A61B 5/113 378/8 |

(Continued)

OTHER PUBLICATIONS

Abd-Elmoniem, Khaled et al., "Free-breathing inner-volume black-blood imaging of the human heart using two-dimensionally selective local excitation at 3T." Magnetic resonance in medicine, vol. 68, No. 3, 2012, pp. 822-829.

(Continued)

*Primary Examiner* — Dixomara Vargas
(74) *Attorney, Agent, or Firm* — Meunier Carlin & Curfman LLC

(57) ABSTRACT

Some aspects of the present disclosure relate to systems and methods for free-breathing cine DENSE MRI using self-navigation. In one embodiment, a method includes acquiring magnetic resonance data for an area of interest of a subject, wherein the acquiring comprises performing sampling with phase-cycled, cine displacement encoding with stimulated echoes (DENSE) during free-breathing of the subject; identifying, from the acquired magnetic resonance data, a plurality of phase-cycling data pairs corresponding to matched respiratory phases of the free-breathing of the subject; reconstructing, from the plurality of phase-cycling data pairs, a plurality of intermediate self-navigation images; performing motion correction by estimating, from the plurality of intermediate self-navigation images, the respiratory position associated with the plurality of phase-cycling data pairs; and reconstructing a plurality of motion-corrected cine DENSE images of the area of interest of the subject.

25 Claims, 16 Drawing Sheets
(12 of 16 Drawing Sheet(s) Filed in Color)

(56) References Cited

U.S. PATENT DOCUMENTS

| | | | |
|---|---|---|---|
| 7,813,537 B2 | 10/2010 | Epstein et al. | |
| 8,700,127 B2 | 4/2014 | Salerno et al. | |
| 9,183,626 B2 | 11/2015 | Zhao et al. | |
| 9,224,210 B2 | 12/2015 | Epstein et al. | |
| 10,039,473 B2* | 8/2018 | Zhao | A61B 5/061 |
| 2004/0102695 A1* | 5/2004 | Stergiopoulos | G01R 33/56325 |
| | | | 600/413 |
| 2006/0074300 A1* | 4/2006 | Green | A61B 5/113 |
| | | | 600/427 |
| 2013/0303892 A1* | 11/2013 | Zhao | A61B 5/061 |
| | | | 600/424 |
| 2015/0285889 A1 | 10/2015 | Chen et al. | |
| 2016/0098835 A1 | 4/2016 | Zhao et al. | |
| 2016/0148378 A1 | 5/2016 | Salerno et al. | |
| 2016/0242710 A1* | 8/2016 | Grbic | A61B 6/12 |

OTHER PUBLICATIONS

Auger, D.A. et al., Imaging left-ventricular mechanical activation in heart failure patients using cine DENSE MRI: Validation and implications for cardiac resynchronization therapy, Journal of Magnetic Resonance Imaging, 2017, 10 pages.

Cai, X. et al., "Free-breathing 2D Cine DENSE with localized excitation, self-navigation and motion correction," Journal Cardiovascular Magnetic Resonance, 2016, 18(Supp 1), 3 pages.

Chen, X. et al., "Accelerated cine DENSE MRI using compressed sensing and parallel imaging," Journal of Cardiovascular Magnetic Resonance, 2014; 16(1):W16, 3 pages.

Epstein, F. et al., "Displacement-encoded cardiac MRI using cosine and sine modulation to eliminate (CANSEL) artifact-generating echoes," Magnetic Resonance in Medicine, vol. 52, No. 4, (2004), pp. 774-781.

Fessler, J. et al., "Nonuniform fast Fourier transforms using min-max interpolation," Signal Process. IEEE Trans., vol. 51, No. 2, 2003, 19 pages.

Florescu, M. et al., Chemotherapy-induced cardiotoxicity, Maedica, (Buchar), 2013, vol. 8, No. 1, pp. 59-67.

Flynn, T.J., editor Consistent 2-D Phase unwrapping guided by a quality map, Geoscience and Remote Sensing Symposium, 1996 IGARSS'96'Remote Sensing for a Sustainable Future', International, 1996, IEEE, pp. 2057-2059.

Hamlet, S.M. et al., Optimal configuration of respiratory navigator gating for the quantification of left ventricular strain using spiral cine displacement encoding with stimulated echoes (DENSE) MRI; Journal of Magnetic Resonance Image, 2017, vol. 45, No. 3, pp. 786-794.

Kapur, J. N. et al., "A new method for gray-level picture thresholding using the entropy of the histogram," Computer Vision, Graphics, and Image Processing, vol. 29, No. 3, 1985, pp. 273-285.

Kim, D. et al., "Myocardial Tissue Tracking with Two-Dimensional Cine Displacement-Encoded MR Imaging: Development and Initial Evaluation 1," Radiology, vol. 230, No. 3, 2004, pp. 862-871.

Lai, P. et al., A dual-projection respiratory self-gating technique for whole-heart coronary MRA, Journal of Magnetic Resonance Imaging, 2008, vol. 28, No. 3, pp. 612-620.

Larson, A.C. et al., Preliminary investigation of respiratory self-gating for free-breathing segmented cine MRI, Magnetic Resonance in Medicine, 2005, vol. 53, No. 1, pp. 159-168.

Larson, A.C. et al., Self-gated cardiac cine MRI, Magnetic Resonance in Medicine, 2004, vol. 51, No. 1, pp. 93-102.

Lingala, S.G. et al., "Accelerated dynamic MRI exploiting sparsity and low-rank structure: kt SLR," Med. Imagin, IEEE Trans., 2011, vol. 30, No. 5, pp. 1042-1054.

Lustig, M. et al., Sparse MRI: The application of compressed sensing for rapid MR imaging, Magnetic Resonance in Medicine, 2007, vol. 58, No. 6, pp. 1182-1195.

Moghari, M.H. et al., Free-breathing steady-state free precession cine cardiac magnetic resonance with respiratory navigator gating, Magnetic Resonance in Medicine, 2015, vol. 73, No. 4, pp. 1555-1561.

Osman, N. F. et al., Cardiac motion tracking using CNE harmonic phase (HARP) magnetic resonance imaging, Magnetic Resonance in Medicine: Official Journal of the Society of Magnetic Resonance in Medicine/Society of Magnetic Resonance in Medicine, 1999, vol. 42, No. 6, pp. 1048-1060.

Pan, L. et al., "Real-time imaging of regional myocardial functon using fast-SENC.," Magnetic Resonance in Medicine, Feb. 2006, vol. 55, No. 2, pp. 386-395.

Pang, J. et al., "ECG and navigator-free four-dimensional whole heart coronary MRA for simultaneous visualization of cardia anatomy and function," Magnetic Resonance in Medicine, 2014, 10 pages.

Pang, J. et al., Whole-heart coronary MRA with 100% respiratory gating efficiency: Self-navigated three-dimensional retrospective image-based motion correction (TRIM), Magnetic Resonance in Medicine, 2014, vol. 71, No. 1, pp. 67-74.

Prinzen, F.W. et al., Mapping of regional myocardial strain and work during ventricular pacing: Experimental study using magnetic resonance imaging tagging, Journal of the American College of Cardiology, 1999, vol. 33, No. 6, pp. 1735-1742.

Shannon, Claude E., "A mathematical theory of communication," ACM SIGMOBILE Mobile Computing and Communications Review, 2001, vol. 5, No. 1, pp. 3-55.

Shechter, G. et al., "MR Motion Correction of 3D Affine Deformations," Proc. Int. Soc. Mag. Reson. Med., 2003, vol. 11, No. C, p. 1054.

Spottiswoode, B.S. et al., "Tracking Myocardial Motion From Cine DENSE Images Using Spatiotemporal Phase Unwrapping and Temporal Fitting," IEEE Trans. Med. Imaging, Jan. 2007, vol. 26, No. 1, pp. 15-30.

Stehning, C. et al., "Free-breathing whole-heart coronary MRA with 3D radial SSFP and self-navigated image reconstruction," Magnetic Resonance in Medicine, 2005, vol. 54, No. 2, pp. 476-480.

Sussman, M.S. et al., "Variable-density adaptive imaging for high-resolution coronary artery MRI," Magnetic Resonance in Medicine, 2002, vol. 48, No. 5, pp. 753-764.

Thavendiranathan, P. et al., "Use of myocardial strain imaging by echocardiography for the early detection of cardiotoxicity in patients during and after cancer chemotherapy: a system review," Journal of the American College of Cardiology, 2014, vol. 63, No. 25, pp. 2751-2768.

Pang, J., et al., Accelerated Whole-Heart Coronary MRA Using Motion-Corrected Sensitivity Encoding With Three-Dimensional Projection Reconstruction, Magnetic Resonance in Medicine, 2015, vol. 73, pp. 284-291.

Usman, M. et al., "Motion corrected compressed sensing for free-breathing dynamic cardiac MRI," Magnetic Resonance in Medicine, Society of Magnetic Resonance in Medicine, 2013, vol. 70, No. 2, pp. 504-516.

Van Heeswijk, R.B. et al., "Motion compensation strategies in magnetic resonance imaging," Critical Reviews™ in Biomedical Engineering, 2012, vol. 40, No. 2, pp. 99-119.

Zhong, X. et al., "Balanced multipoint displacement encoding for DENSE MRI," Magnetic Resonance in Medicine, 2009, vol. 61, No. 4, pp. 981-988.

Zhong, X. et al., "Imaging three-dimensional myocardial mechanics using navigator-gated volumetric spiral cine DENSE MRI," Magn. Reson. Med., Oct. 2010, vol. 64, No. 4, pp. 1089-1097.

Zhong, X. et al., "Selective suppression of artifact-generating echoes in cine DENSE using through-plane dephasing " Magnetic Resonance in Medicine, 2006 vol. 56, No. 5, pp. 1126-1131.

* cited by examiner

SYSTEMS AND METHODS FOR FREE-BREATHING CINE DENSE MRI USING SELF-NAVIGATION

CROSS-REFERENCE TO RELATED APPLICATION

This application claims priority to and benefit of U.S. Provisional Patent Application Nos. 62/325,754, filed Apr. 21, 2016, and 62/452,568, filed Jan. 31, 2017, each of which is hereby incorporated by reference herein in its entirety as if fully set forth below.

STATEMENT OF RIGHTS UNDER FEDERALLY-SPONSORED RESEARCH

This invention was made with government support under grants EB001763 and HL115225, awarded by the National Institutes of Health. The government has certain rights in the invention.

BACKGROUND

Myocardial strain imaging is increasingly used for the assessment of cardiac function ([1-4]). Cine Displacement Encoding with Stimulated Echoes (DENSE) magnetic resonance imaging (MRI), ([5, 6]) is an established myocardial strain imaging technique with high accuracy and rapid data analysis. However, current DENSE protocols require breath-holding, which limits its use in patients who cannot hold their breath, such as pediatric patients and heart failure patients. DENSE MRI uses segmented data acquisition where data are acquired over multiple heartbeats and respiratory motion among the acquisitions of different segments induces artifacts such as blurriness in the images ([7]).

For DENSE imaging in particular, suppression of the artifact-generating echo due to T1 relaxation is vital, which, with breath-holding, is generally achieved by subtraction of complementary phase-cycled datasets ([5, 8]). However, with free-breathing, cancellation of this echo is compromised when phase-cycled datasets are acquired at different respiratory positions. Poor suppression of the T1 relaxation echo due to respiration can result in severe striping artifacts in images. Therefore, breath-holding (BH) is conventionally used to manage these artifacts. BH is rapid and efficient, but not always feasible, especially for many heart failure patients and pediatric patients.

Previously, a diaphragm navigator (dNAV) method has been applied to enable free-breathing (FB) cine DENSE acquisitions ([9]) but with greatly decreased efficiency (~30%) and variable image quality ([9, 10]). Additionally, the conventional dNAV method requires extra setup of the dNAVs. Another approach is to extract respiratory motion information from the imaging data itself, termed self-navigation. Self-navigation is advantageous compared to dNAV because it extracts motion from acquired image data and often directly estimates motion of the heart due to respiration. Self-navigation can also be combined with rigid motion correction in the k-space domain to improve efficiency. One self-navigation method enables reconstruction of lower-resolution intermediate images (iNAVs) and estimation of respiratory motion using image registration ([11-15]). This strategy is especially suitable for non-Cartesian sampling trajectories that have greater sampling densities near the center of k-space.

In addition to self-navigation, there are other strategies that can enhance the performance of free-breathing imaging. Localized signal generation ([16]) can reduce the field of view (FOV) and therefore reduce motion artifacts generated from unwanted tissues. ([17]) With a smaller FOV, the motion of heart can be represented with a simpler model such as an affine motion.

It is with respect to these and other considerations that the various aspects of the disclosed technology as described below are presented.

SUMMARY

Some aspects of the present disclosure relate to systems and methods for free-breathing cine DENSE MRI using self-navigation. One aspect of the present disclosure relates to a method for free-breathing cine DENSE MRI. The method can include acquiring magnetic resonance data for an area of interest of a subject. The acquiring can comprise performing sampling with phase-cycled, cine displacement encoding with stimulated echoes (DENSE) during free-breathing of the subject.

The method can also include identifying, from the acquired magnetic resonance data, a plurality of phase-cycling data pairs corresponding to matched respiratory phases of the free-breathing of the subject. In some embodiments, identifying the plurality of phase-cycling data pairs corresponding to matched respiratory phases can include determining whether a plurality of phase-cycling data meet match-making criterion associated with respiratory motion of the subject. In some embodiments, the match-making criterion can include a residual T1 relaxation echo energy determined by subtracting the plurality of phase-cycling data to identify phase-cycling data pairs at matched respiratory phases. Phase-cycling data at matched respiratory phases can have, for instance, a lower residual T1-relaxation echo energy than phase-cycling data at different respiratory phases.

In some embodiments, identifying the plurality of phase-cycling data pairs corresponding to matched respiratory phases can include reconstructing a plurality of pre-subtraction intermediate self-navigation images (pre-iNAVS). Following, motion estimation can be performed between a plurality of pre-subtraction intermediate self-navigation images to identify a plurality of phase-cycling data pairs corresponding to matched respiratory phases.

In some embodiments, the method can comprise reconstructing, from the plurality of phase-cycling data pairs, a plurality of intermediate self-navigation images of the area of interest of the subject; performing motion correction by estimating, from the plurality of intermediate self-navigation images, the respiratory position associated with the plurality of phase-cycling data pairs; and reconstructing a plurality of motion-corrected cine DENSE images of the area of interest of the subject.

In some embodiments, the method can further comprise performing principal component analysis (PCA)-based filtering to suppress a T1 relaxation echo. Additionally, in some embodiments, performing motion correction by estimating, from the plurality of intermediate self-navigation images, the respiratory position associated with the plurality of phase-cycling data pairs includes using slice-selective radiofrequency pulses such that the stimulated echo generates a signal from a region focused on the area of interest of the subject.

In another aspect, the present disclosure relates to a system for free-breathing cine DENSE MRI. The system can include a data acquisition device configured to acquire magnetic resonance data for an area of interest of a subject, wherein the acquiring comprises performing sampling with phase-cycled, cine displacement encoding with stimulated echoes (DENSE) during free-breathing of the subject. Additionally, the system can include one or more processors coupled to the data acquisition device and configured to cause the system to perform functions including: identifying, from the acquired magnetic resonance data, a plurality of phase-cycling data pairs corresponding to matched respiratory phases of the free-breathing of the subject; reconstructing, from the plurality of phase-cycling data pairs, a plurality of intermediate self-navigation images of the area of interest of the subject; performing motion correction by estimating, from the plurality of intermediate self-navigation images, the respiratory position associated with the plurality of phase-cycling data pairs; and reconstructing a plurality of motion-corrected cine DENSE images of the area of interest of the subject.

In another aspect, the present disclosure relates to a non-transitory computer-readable medium having stored instructions that, when executed by one or more processors, cause one or more computing devices to perform functions that comprise: acquiring magnetic resonance data for an area of interest of a subject, wherein the acquiring comprises performing sampling with phase-cycled, cine displacement encoding with stimulated echoes (DENSE) during free-breathing of the subject; identifying, from the acquired magnetic resonance data, a plurality of phase-cycling data pairs corresponding to matched respiratory phases of the free-breathing of the subject; reconstructing, from the plurality of phase-cycling data pairs, a plurality of intermediate self-navigation images of the area of interest of the subject; performing motion correction by estimating, from the plurality of intermediate self-navigation images, the respiratory position associated with the plurality of phase-cycling data pairs; and reconstructing a plurality of motion-corrected cine DENSE images of the area of interest of the subject.

Other aspects and features according to the example embodiments of the present disclosure will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale. The patent or application file contains at least one drawing executed in color. Copies of this patent or patent application publication with color drawing(s) will be provided by the Office upon request and payment of the necessary fee.

DETAILED DESCRIPTION

Figure 1:
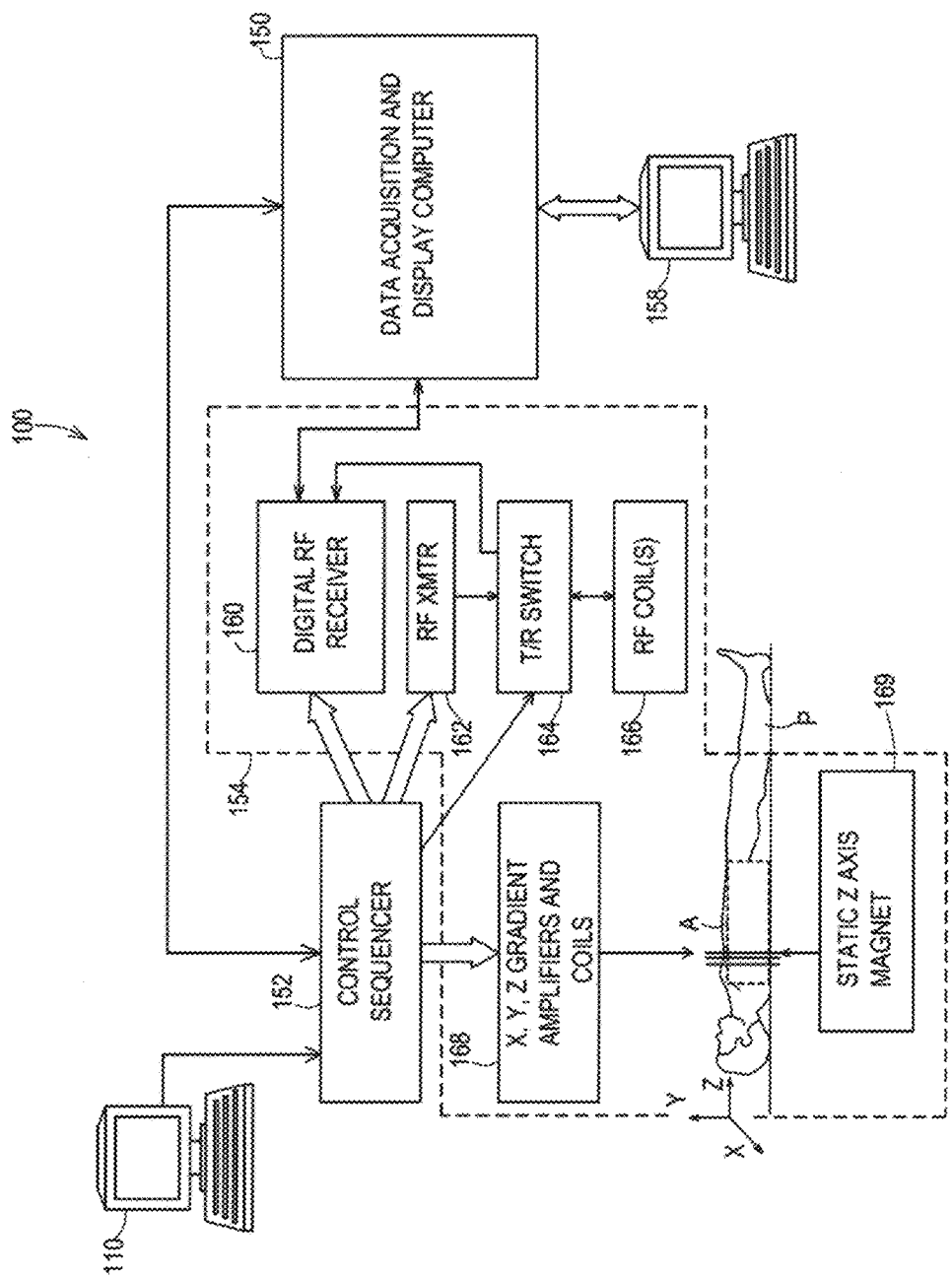
FIG. 1 is a system diagram illustrating an imaging system capable of implementing aspects of the present disclosure, in accordance with one or more example embodiments.

In some aspects, the present disclosure relates to systems and methods for reducing artifacts in free-breathing cine DENSE MRI. Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. For example "[3]" corresponds to the 3rd reference in the list, i.e. Thavendiranathan P, Poulin F, Lim K-D, Plana J C, Woo A, Marwick T H. Use of myocardial strain imaging by echocardiography for the early detection of cardiotoxicity in patients during and after cancer chemotherapy: a systematic review. Journal of the American College of Cardiology. 2014; 63(25):2751-68. All references cited and discussed in this specification are incorporated herein by reference in their entireties and to the same extent as if each reference was individually incorporated by reference.

A detailed description of aspects of the present disclosure, in accordance with various example embodiments, will now be provided with reference to the accompanying drawings. The drawings form a part hereof and show, by way of illustration, specific embodiments and examples. In referring to the drawings, like numerals represent like elements throughout the several figures.

FIG. 1 is a system diagram illustrating an operating environment capable of implementing aspects of the present disclosure in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a subject P to be imaged, for example, to implement magnetic resonance imaging sequences in accordance with various example embodiments of the present disclosure described herein. An image of an area of interest A of the subject P (which may also be referred to herein as a "region of interest") may be shown on display 158. The display 158 may be implemented through a variety of output interfaces, including a monitor, printer, or data storage.

The area of interest A corresponds to a region associated with one or more physiological activities in subject P. The area of interest shown in the example embodiment of FIG. 1 corresponds to a chest region of subject P, but it should be appreciated that the area of interest for purposes of implementing various aspects of the disclosure presented herein is not limited to the chest area. It should be recognized and appreciated that the area of interest in various embodiments may encompass various areas of subject P associated with various physiological characteristics.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
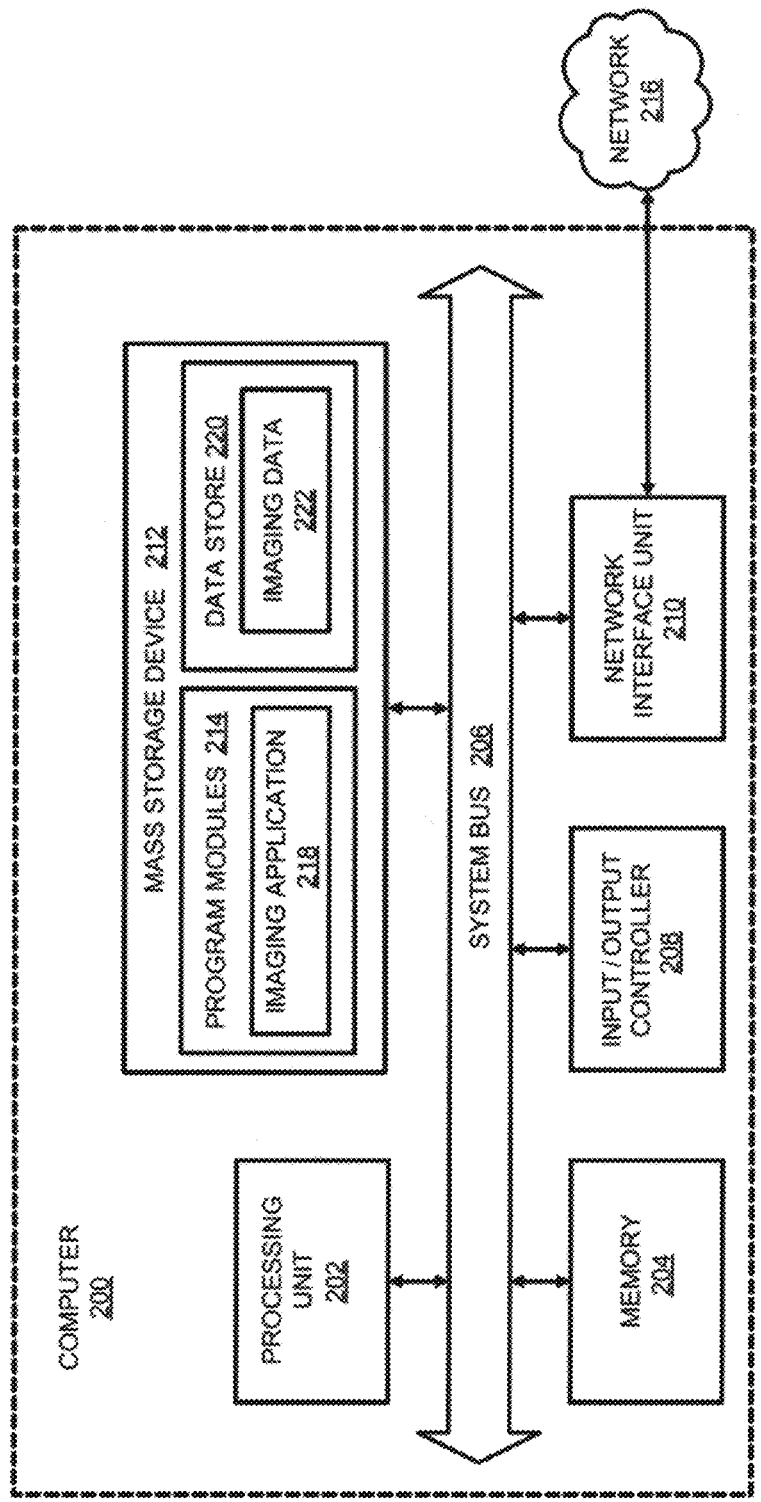
FIG. 2 is a computer architecture diagram showing a general computing system capable of implementing aspects of the present disclosure, in accordance with one or more example embodiments.

FIG. 2 is a computer architecture diagram showing a general computing system capable of implementing aspects of the present disclosure in accordance with one or more embodiments described herein. A computer 200 may be configured to perform one or more functions associated with embodiments illustrated in one or more of FIGS. 3-14. It should be appreciated that the computer 200 may be implemented within a single computing device or a computing system formed with multiple connected computing devices. The computer 200 may be configured to perform various distributed computing tasks, in which processing and/or storage resources may be distributed among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform associated with embodiments illustrated in one or more of FIGS. 3-14 discussed below. The program modules 214 may include an imaging application 218 for performing data acquisition and/or processing functions as described herein, for example to acquire and/or process image data corresponding to magnetic resonance imaging of an area of interest. The computer 200 can include a data store 220 for storing data that may include imaging-related data 222 such as acquired data from the implementation of magnetic resonance imaging in accordance with various embodiments of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk, it should be appreciated by those skilled in the art that computer-storage media can be any available computer storage media that can be accessed by the computer 200.

By way of example and not limitation, computer storage media (also referred to herein as "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. "Computer storage media", "computer-readable storage medium" or "computer-readable storage media" as described herein do not include transitory signals.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems.

The computer 200 may also include an input/output controller 208 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example a graphical user interface, for managing various functions performed by the computer 200. The input/output controller 208 may be configured to manage output to one or more display devices for displaying visual representations of data, such as display monitors/screens that are integral with other components of the computer 200 or are remote displays.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology.

The computer storage media may also represent secondary storage, whether implemented as hard drives or otherwise. Hard drive implementations may be characterized as solid state, or may include rotating media storing magnetically-encoded information. The program modules 214, which include the imaging application 218, may include instructions that, when loaded into the processing unit 202 and executed, cause the computer 200 to provide functions associated with one or more example embodiments and implementations illustrated in FIGS. 3-14. The program modules 214 may also provide various tools or techniques by which the computer 200 may participate within the overall systems or operating environments using the components, flows, and data structures discussed throughout this description.

Further details of certain example embodiments of the present disclosure will now be discussed. Some aspects of the present disclosure relate to systems and methods for reducing artifacts in 2D free-breathing cine DENSE MRI. By including a match-making process, cancellation of the artifact-generating T1 relaxation signal can be optimized along with heart-localized, image-based motion estimation and k-space correction after phase-cycling subtraction. In some embodiments, match-making criterion can be utilized to identify phase-cycling data pairs with optimal cancellation of the T1 relaxation echo and thereby reduce artifacts from the T1 relaxation echo. By identifying phase-cycling pairs at matched respiratory phases, artifacts caused by the T1 relaxation echo can be removed.

In some embodiments, the match-making criterion can identify phase-cycling pairs from different respiratory positions. Thus, for example, it is possible that one phase-cycling pair is at end-inspiration and another one is at end-expiration. Therefore, following application of the described match-making methods, respiratory motion can be estimated among different phase-cycling pairs by estimating motion from post-subtraction iNAVs and the acquired k-space data can be corrected to compensate for respiratory motion. Thus, free-breathing cine DENSE methods described herein in accordance with embodiments of the present disclosure can utilize self-navigation, k-space motion compensation, and properties of T1 relaxation echoes to substitute motion tracking properties of stimulated echoes to achieve localized signal generation and automated motion estimation, particularly applicable to free-breathing acquisition.

Free-Breathing Cine DENSE Framework

Figure 3:
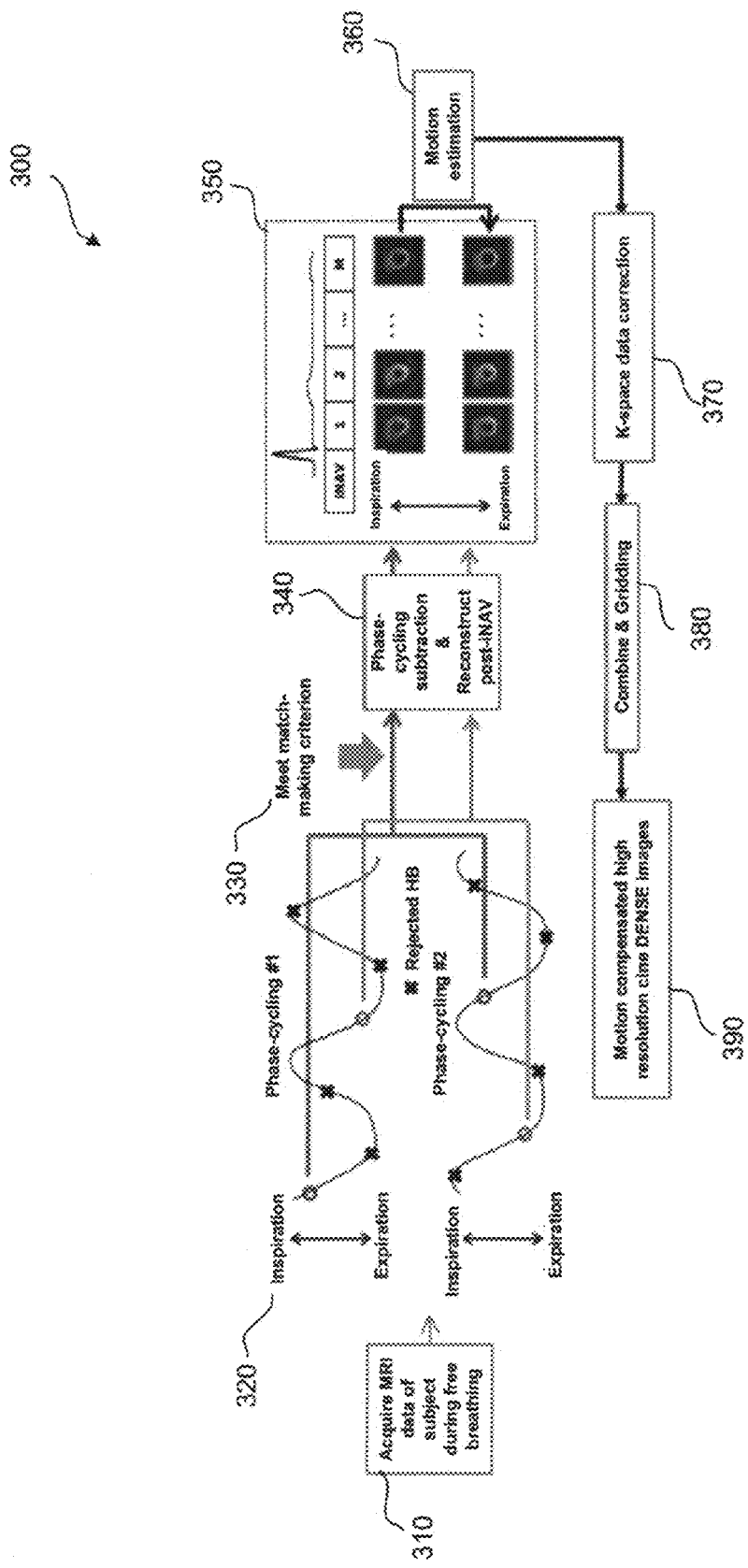
FIG. 3 is a diagram illustrating respiratory motion compensation for free-breathing cine DENSE reconstruction, in accordance with example embodiments.

FIG. 3 illustrates a method for free-breathing cine DENSE MRI utilizing different match-making criteria respectively, in accordance with example embodiments of the present disclosure. Some aspects of the present disclosure can relate to systems and methods for free-breathing cine DENSE MRI using self-navigation. In one embodiment (collectively labeled 300), MRI data in an area of interest of a subject can be acquired using cine DENSE during free-breathing (310). Some embodiments can include methods for compensating respiratory artifacts by optimizing cancellation of the T1 relaxation echo with a match-making process and subsequent image-based (iNAV) motion estimation and correction. Match-making can include identifying phase-cycling data pairs that are at the same respiratory position and therefore have optimal cancellation of the T1 relaxation echo (320). In some embodiments, match-making can be achieved using match-making criterion, and data pairs that meet the criterion can be accepted (330). Following identification of matched phase-cycling data pairs, phase-cycling subtraction and reconstruction of post-iNAVs can be performed (340). From the post-iNAVs motion estimation can be performed (350, 360) followed by k-space data correction (370), gridding (380), and reconstruction of motion-compensated cine DENSE images (390).

Cine DENSE Pulse Sequence with Outer-Volume-Suppression

Figure 4:
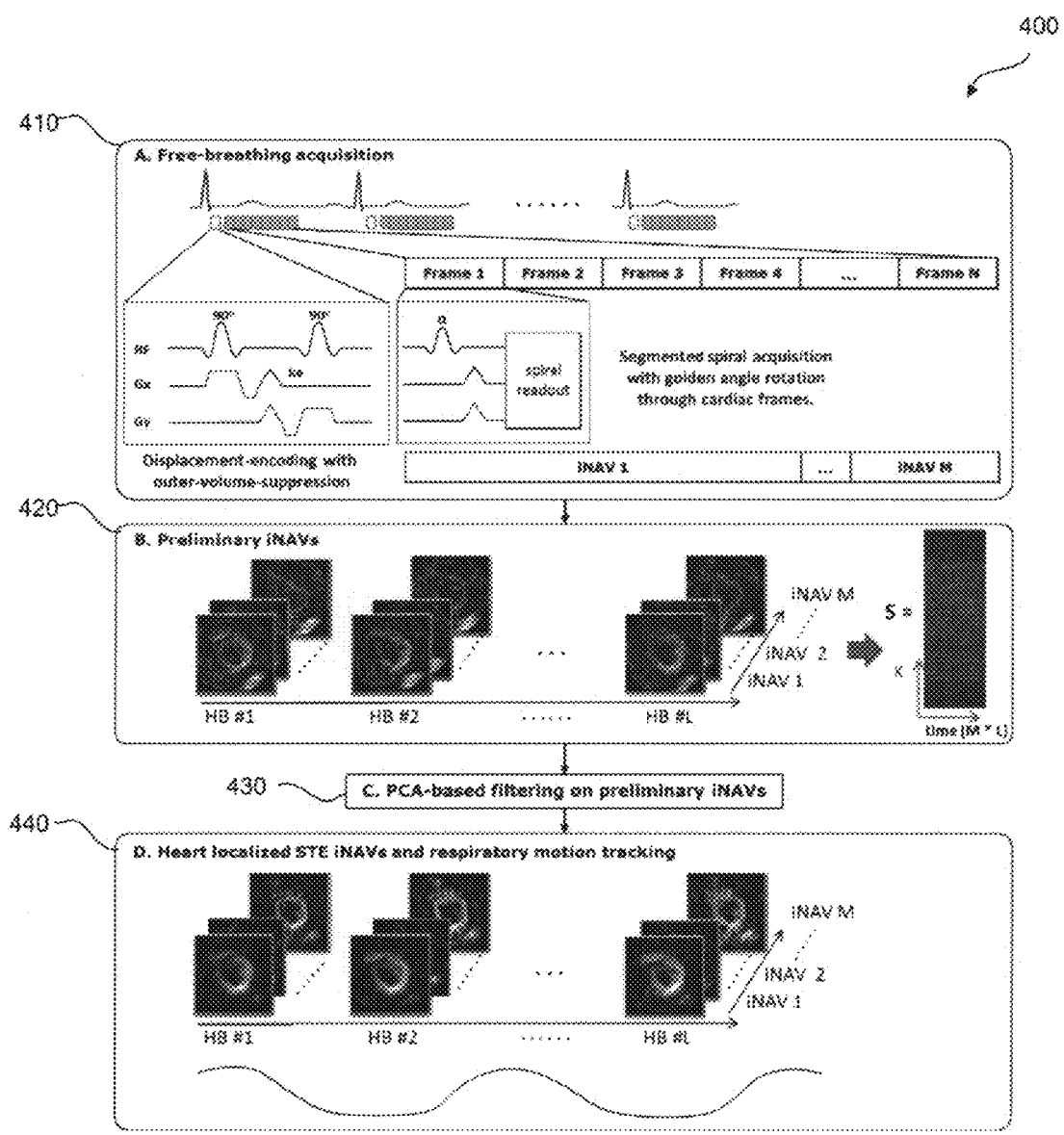
FIG. 4 is a diagram illustrating a method for reducing artifacts in free-breathing cine DENSE using heart-localized iNAVs for automated respiratory motion tracking, in accordance with example embodiments.

Some aspects of the present disclosure relate to systems and methods for reducing artifacts in 2D free-breathing cine DENSE. FIG. 4 is a schematic of free-breathing cine DENSE data acquisition with iNAV reconstruction and automated respiratory motion tracking, in accordance with example embodiments of the present disclosure. As shown in FIG. 4, cine DENSE MRI can use ECG-triggering during magnetic resonance data acquisition and displacement encoding pulses that can be applied immediately after each ECG trigger, followed by multi-frame acquisition.

In some embodiments, the displacement encoding pulses can include two 90-degree RF pulses and an encoding gradient. Additionally, in some embodiments, segmented spiral trajectory with golden angle rotation through time can be used during data acquisition. Segmented spiral trajectories can be advantageous as they can support reconstruction of iNAVs. Regular sine RF pulses can be utilized, but other types of RF pulses potentially with improved slice profile may be used as well. For data acquisitions, a spiral trajectory can be used and rotated with golden angle through cardiac frames. With golden angle rotation, intermediate self-navigation images (iNAV) can be reconstructed by combining multiple consecutive frames for motion estimation. In an example embodiment, a rotation angle of 137.5 degrees can be used and each iNAV frame can correspond to four consecutive DENSE frames. While specific examples of rotation angle are provided, the rotation angle of the trajectory can be adjusted as desired depending on design.

In some embodiments, outer-volume-suppression of the simulated echoes to facilitate motion estimation can be used. Outer-volume-suppression of stimulated echo can be implemented by modifying the two 90-degree RF pulses to be orthogonally slice-selective. With this method, only voxels within the region where the two slice profiles intersect could generate a stimulated echo signal ([16]). Tissues such as in the liver and chest wall do not contribute significant stimulated echo signal. Through this method, respiratory motion estimation can be simplified.

Motion-Based Match-Making

FIG. 4 illustrates a method 400 for free-breathing cine DENSE MRI including reconstruction of pre-iNAVs to assist with suppression of the T1 relaxation echo, in accordance with example embodiments of the present disclosure. As illustrated at FIG. 4, magnetic resonance data can be acquired in an area of interest of the subject, wherein the acquiring can comprise performing sampling with phase-cycled, cine DENSE during free-breathing of the subject (410), using some or all of the previously-discussed methods. Following, a plurality of phase-cycling data pairs can be identified corresponding to matched respiratory phases of the free-breathing of the subject. For instance, as illustrated at FIG. 4, match-making criterion can be used including estimated motion between phase-cycled data from preliminary image-based navigators reconstructed using pre-subtraction data (pre-iNAV) (420). Given that cancellation of the T1 relaxation echo can be most effective when the phase-cycled data are acquired at the same position, suppression of the T1 relaxation echo can be optimized by matching both respiratory position and direction of the phase-cycled data pairs.

Mathematically, the respiratory motion of each heartbeat can be represented by a vector $\vec{r}(i)=(d_{i,Sys},d_{i,Dia})$ where $d_{i,Sys}$ indicates the respiratory position at systole and $d_{i,Dia}$ indicates respiratory position at diastole. If only one navigator is acquired at diastole or systole, then the vector becomes $\vec{r}(i)=(d_{i-i,Dia},d_{i,Dia})$ or $\vec{r}(i)=(d_{i,Sys},d_{i+1,Sys})$ respectively. Therefore, the inter-phase-cycling motion can be defined as $D(i,j)=\|\vec{r}_{p1,i}-\vec{r}_{p2,j}\|_2$, where $\vec{r}_{p1,i}$ indicates the respiratory motion vector of $i_{th}$ heartbeat of the first phase-cycling acquisition and $\vec{r}_{p2,j}$ the respiratory motion vector of $j_{th}$ heartbeat of the second phase-cycling acquisition. This definition applies to respiration tracked by both diaphragm navigation and image-based self-navigation with either one or two iNAVs per heartbeat.

Using multiple pre-iNAVs per heartbeat, the inter-phase-cycling motion can be rewritten as $$D(i,j) = sqrt\left(\sum_{m=1}^{M} \vec{T}\{H1_{i,m}, H2_{j,m}\}^2/M\right),$$

where $H1_{i,m}$ indicates the $m_{th}$ iNAV of $i_{th}$ heartbeat of the first phase-cycling dimension, and $H2_{j,m}$ indicates the $m_{th}$ iNAV of $j_{th}$ heartbeat of the second phase-cycling dimension, where $\vec{T}$ indicates the 2D translations between $H1_{i,m}$ and $H2_{j,m}$ and where M represents the total number of iNAVs per heartbeat. In an example embodiment, three systolic pre-iNAVs can be used for estimation of inter-phase-cycling motion and motion estimation can be performed using the Advanced Normalization Tools (ANTS) registration toolbox ([18]). Other image registration methods and toolboxes now known or later discovered can be used to estimate respiratory motion as well.

Of all the possible phase-cycling data pairs, phase-cycling data pairs with minimal inter-phase-cycling motions can be identified as optimal data pairs for phase-cycling subtraction and accepted for reconstruction, as illustrated in FIG. 3. In one embodiment, a fixed number of data pairs can be accepted for fair comparison with the dNAV accept/reject method. However, an adaptive determination of inter-phase-cycling motion threshold may be a variation of the algorithm and can likely improve efficiency. In some embodiments, as illustrated in FIG. 4 and described in more detail below, pre-iNAVs can be reconstructed with low-pass filtering in k-space and PCA-based filtering to remove the major T1 relaxation signal (430).

Following identification of phase-cycling data pairs, phase-cycling subtraction can be performed with selected data pairs to suppress the T1 relaxation echo. Then with post-subtraction data, image-based navigators (post-iNAV) can be reconstructed by gridding data of consecutive cardiac frames together and multiple iNAVs within each cardiac cycle can be reconstructed (440). Respiratory motion can be estimated from the post-iNAVs by image registration and used for motion compensation in k-space. Motion-corrected k-space data can then be combined to reconstruct high resolution cine DENSE images using density compensated non-uniform discrete Fourier Transform (NUFFT) ([19]).

Residual T1 Echo Energy Based Match-Making

Figure 5:
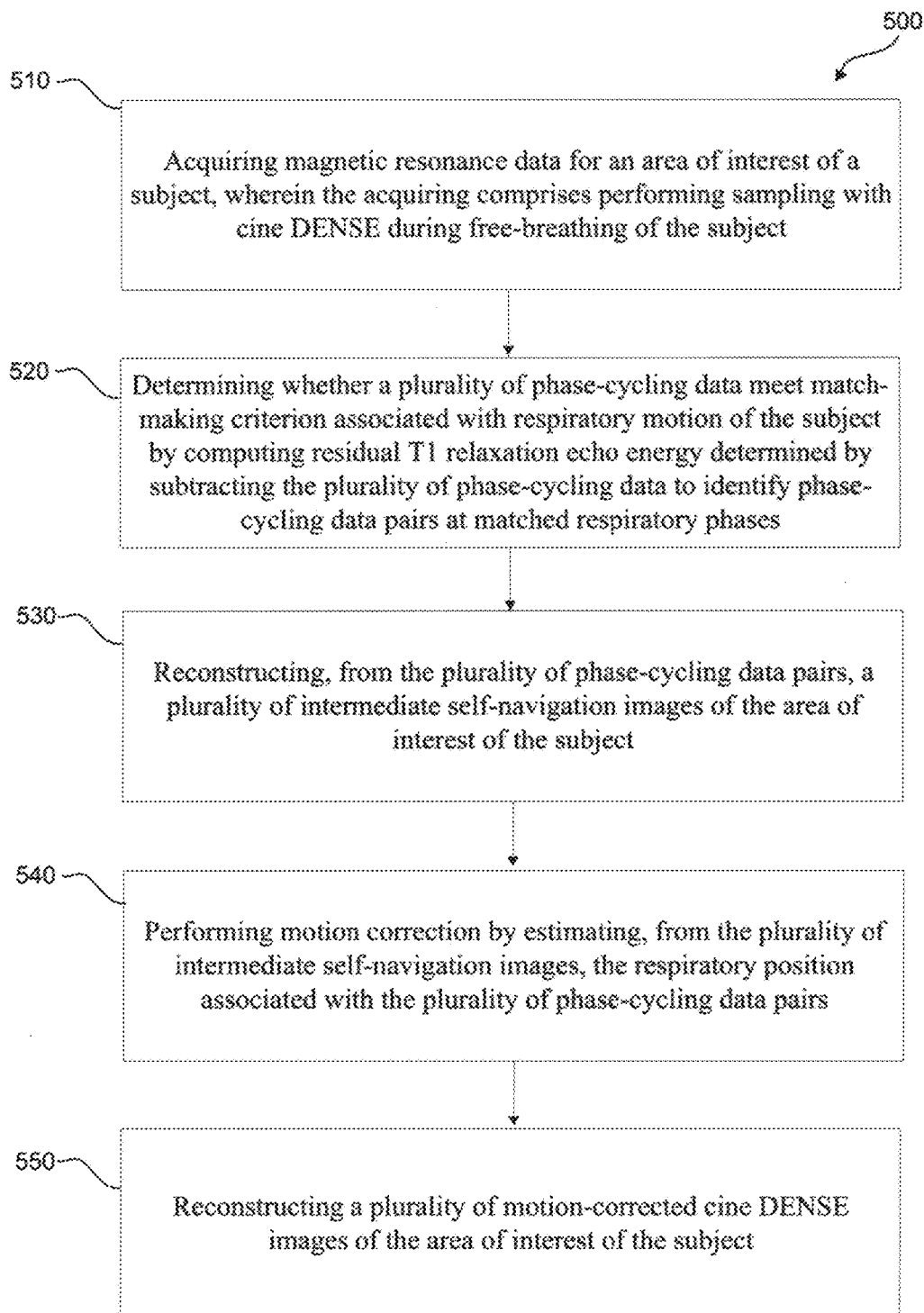
FIG. 5 is a flowchart illustrating a method for reducing artifacts in free-breathing cine DENSE using a computed residual T1 echo energy, in accordance with example embodiments.

FIG. 5 illustrates an example method 500 for free-breathing cine DENSE MRI including computation of residual T1 echo energy for suppression of the T1 relaxation echo, in accordance with an embodiment of the present disclosure. As illustrated at FIG. 5, after acquisition of magnetic resonance data (510), match-making criterion can be determined comprising residual energy of T1 relaxation echo determined after phase-cycling subtraction of identified phase-cycled data pairs (520). The T1 relaxation echo often centers at different frequencies from stimulated echoes. While stimulated echoes center at k-space center, the T1 relaxation echo centers at displacement encoding frequencies. Thus, the T1 relaxation echo can increase the energy of k-space in high-frequency regions if not well suppressed. Therefore, the residual T1 echo energy can be an indicator of motion between phase-cycled data and cancellation of the T1 relaxation echo signal can be optimized by minimizing the residual T1 echo energy. The residual T1 echo energy can include the L-2 norm of k-space magnitude with k>half of displacement encoding frequency (ke=0.1 cyc/mm in the example embodiment) after phase-cycling subtraction. With this criterion, phase-cycled data pairs with minimal residual T1 echo energy or with T1 echo energy below a certain threshold can be accepted for later reconstruction processes.

In one embodiment, a phase-cycled data pair with minimal residual T1 echo energy can be accepted for each spiral interleaf. However, in some embodiments, a variation of the algorithm can also permit evaluation of residual T1 echo energy across all interleaves and determination of a threshold value indicative of the residual T1 echo. One implementation can select phase-cycled data pairs heartbeat-wise with averaged residual T1 echo energy across cardiac frames but can also be adapted to emphasize systolic and diastolic frames by imposing different weighting.

As discussed in greater detail below, following match-making using the residual T1 echo energy, a plurality of intermediate self-navigation images of the area of interest of the subject can be reconstructed (530) followed by motion correction by estimating the respiratory position associated with the plurality of phase-cycling data pairs (540) and reconstructing a plurality of motion-corrected cine DENSE images (550).

Rigid Motion Correction after Phase-Cycling Subtraction

After accepting data by match-making, phase-cycling subtraction can be performed to suppress the T1 relaxation echo and post-iNAVs can be reconstructed for motion estimation and compensation, as illustrated in FIGS. 3-5.

As shown in FIG. 3, post-iNAVs can be reconstructed using post-subtraction data without k-space filtering. Then, residual respiratory motion among different phase-cycling pairs and encoding dimensions can be estimated from the post-iNAVs. Rigid motion can be compensated in k-space ([20]) based on the Fourier relationship of motion and k-space data:

$$\hat{d}_i = \frac{e^{j2\pi \hat{k}_i t_i}}{|\det(A_i)|} d_i,$$

where $\hat{k}_i = A_i^{-T} k_i$. $d_i$ is k-space data from the $i_{th}$ segment $\hat{d}_i$ is the motion-corrected version of $d_i$ and $k_i$ is the k-space trajectory of $d_i$. $A_i$ and $t_i$ are the affine motion matrices and 2D translations. In the example embodiment, only 2D translations can be estimated by cross-correlation and corrected but the implementation can be adapted to include affine motion as described.

The motion corrected data can then be combined in k-space to reconstruct high temporal and spatial resolution cine DENSE images by density-weighted Non-Uniform Fast Fourier Transform ([19]).

Pre-Subtraction iNAV and PCA-Based Filtering

As described before, pre-iNAVs can be used to track motion of the heart and estimate motion-based criterion. In some embodiments, the pre-iNAVs can be reconstructed by an intra-heartbeat sliding-window method with low-pass filtering and principle-component-analysis based filtering, as illustrated at FIG. 4.

Outer-volume-suppression of cine DENSE can restrict the stimulated echo signal to a localized region. However, the T1 relaxation signal may still originate from the entire imaging slice. Where the T1 relaxation echo often centers at a different location from the stimulated echo, a k-space filter (as in HARP MRI ([21])) can be used to remove the major T1 relaxation signal and improve quality of the pre-iNAVs. Additionally, in some embodiments, PCA-based filtering can be used to separate the two echoes and further remove T1 relaxation signal by filtering principle components that predominantly correspond to the T1 relaxation echo.

Figure 6:
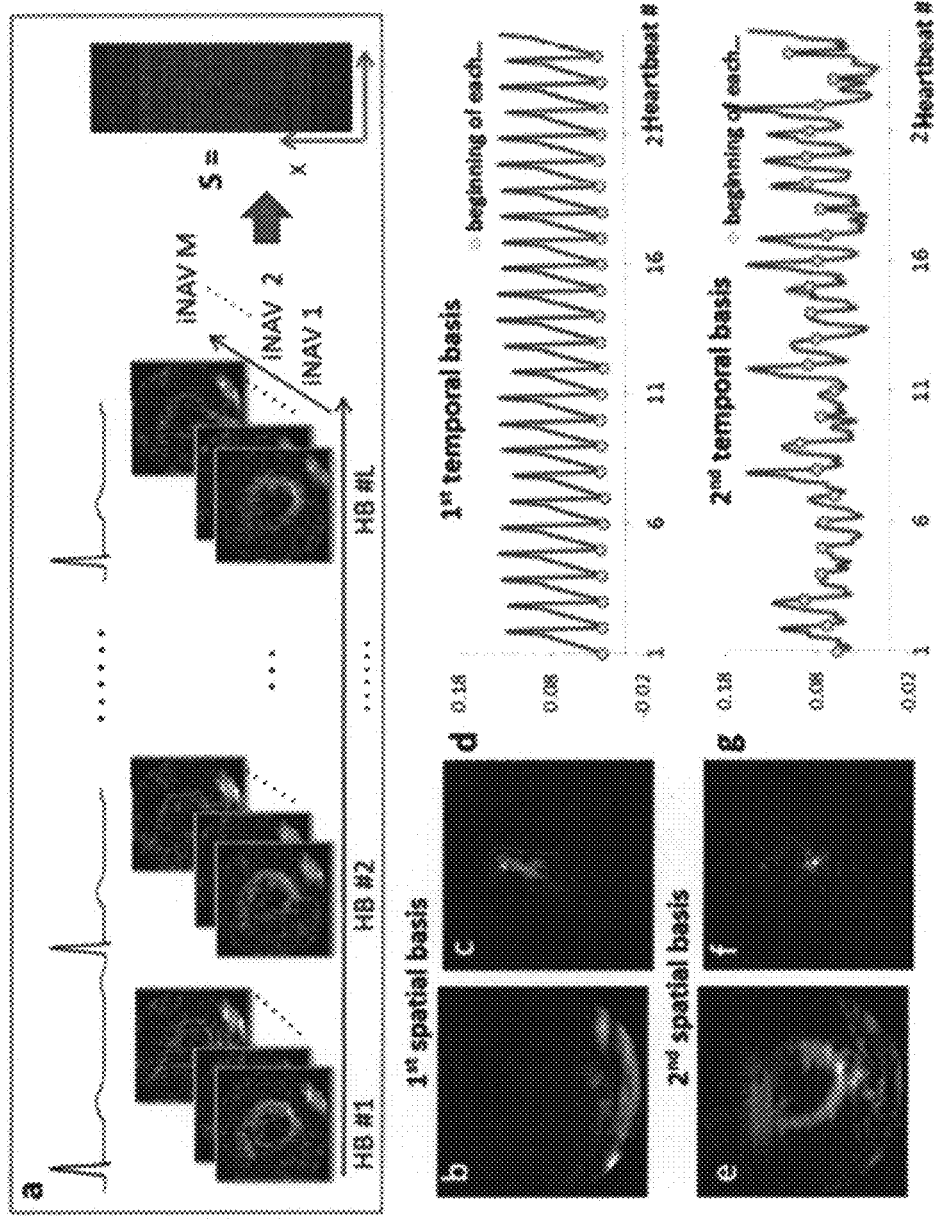
FIG. 6 is a diagram illustrating PCA-based filtering for providing improved pre-iNAVS, in accordance with example embodiments.

FIG. 6 is a diagram of PCA-based filtering for improved pre-INAVs, in accordance with embodiments of the present disclosure. As shown in FIG. 6, the real-time pre-iNAVs can be organized into a Casorati matrix (spatial-temporal). PCA can be performed to decompose the Casorati matrix into spatial and temporal bases. In this example embodiment, the first principle component, which is predominantly the T1 relaxation signal, can be filtered but there can be more than one component that corresponds to T1 relaxation echoes. Also, independent component analysis (ICA) could be used to separate the signals. A more sophisticated algorithm filtering multiple PCA or ICA components can be designed to further reduce T1 relaxation signals. In addition, other methods could also be adopted to improve image quality of iNAVs, such as increasing the displacement encoding frequency and optimizing the encoding directions to separate the echoes in k-space.

Extension to Diffusion-Weighted MRI

The free-breathing framework presented in accordance with embodiments of the present disclosure can be applied to other MR methods that image with stimulated echo as well, such as diffusion-weighted imaging (DWI) using stimulated echo acquisition mode (STEAM). STEAM DWI has high sensitivity in detecting acute ischemia and does not require use of a contrast agent. STEAM DWI has been applied to assess myocardial infarction.

Embodiments of the presently disclosed systems and methods could also be applied to STEAM DWI for cardiac imaging during free breathing. STEAM-DWI images can be generated from similar acquisition methods as displacement encoding in cine DENSE. Therefore, there are stimulated echo and T1 relaxation echo in the signals. Conventionally, the T1 relaxation echo is not prominent in STEAM-MRI due to a high displacement encoding frequency. However, the T1 relaxation echo can be intentionally acquired for motion estimation in free-breathing imaging. In some embodiments, the T1 relaxation signal can be acquired before application of the decoding gradient. In another embodiment, a separate module from stimulated echo acquisition can be used. Following, respiratory motion can be estimated from the T1 relaxation echo using self-navigation methods and used for k-space data correction of stimulated echo signal.

Example Implementations and Results

Various aspects of the present disclosure may be still more fully understood from the following description of example implementations and corresponding results and the images of FIGS. 7-14. Some experimental data are presented herein for purposes of illustration and should not be construed as limiting the scope of the present disclosure in any way or excluding any alternative or additional embodiments.

Methods

Phantom Experiment

A phantom experiment was conducted to demonstrate the concepts of matching phase-cycled data first and correcting motion subsequently. Specifically, a set of phantoms were scanned with one phantom within the field-of-view of cine DENSE and others outside. With outer-volume-suppression, only the phantom inside the field-of-view contributed to stimulated echo signal. Cine DENSE was performed twice and in between the scans, the phantoms were moved in-plane. The phantoms inside and outside of the field-of-view were moved in different directions and with different amount of translations. The purpose is to simulate in-plane motion due to respiration and different motion patterns of heart and other tissues. Cine DENSE data were acquired with the following parameters: field-of-view=260 mm, 6 spiral interleaves, spiral readout length of 4.8 ms, spatial resolution of 3.4 $mm^2$, 2 spiral interleaves per heartbeat, with simulated RR interval of 1000 ms. Displacement encoding frequency was 0.10 cyc/mm, and through plane dephasing frequency was 0.04 cyc/mm.

The following analyses and reconstructions were performed: 1) subtraction of phase-cycled data acquired at matched locations, 2) subtraction of phase-cycled data acquired at mismatched locations, 3) reconstruction combining post-subtraction data from the two different locations, and 4) reconstruction combining post-subtraction data from the two locations with motion compensation.

Evaluation of the Framework in Healthy Subjects

To evaluate the free-breathing cine DENSE framework discussed above in accordance with some embodiments of the present disclosure, the method was tested on healthy volunteers. All imaging were performed on a 3T MRI system (Trio, Siemens, Erlangen, Germany) with a 6-channel phased-array body coil. Six healthy subjects were scanned. Free-breathing datasets were acquired on a mid-ventricular slice with the following parameters: field-of-view of 160 mm, 6 spiral interleaves per image, 2 interleaves per heartbeat, spiral readout length of 3.4 ms, spatial resolution of 3 $mm^2$, TR=15 ms, TE=1.08 ms, temporal resolution of 30 ms, simple 3 pts encoding, 4 averages, and total scan time of 74 heartbeats including 2 heartbeats for field map acquisition. Diaphragm navigators were also acquired at the end of each heartbeat along with the DENSE acquisitions. All images were reconstructed offline in MATLAB (Mathworks, MA, USA). Each dataset was reconstructed three ways: (a) using the proposed framework with motion-based criterion, (b) using the proposed framework with residual T1 echo criterion, and (c) using the conventional dNAV method by accepting data of which the dNAV were within the diaphragm window (+/−3 mm at end-expiration) determined during dNAV scouts. Reconstructions were evaluated by calculating residual T1 relaxation energy of k-space with selected data, signal-to-noise ratio of magnitude images and phase quality of displacement-encoded phase images in myocardial region-of-interest. Image quality was estimated for both end-systolic and diastolic frames. Paired t-test was used for statistical analysis.

To evaluate the effects of PCA-based filtering on iNAVs and motion tracking accuracy, 2D translations calculated estimations using iNAVs without and with PCA-based filtering were compared to manual tracing by calculating root-mean-square error (RMSE). The Wilcoxon signed rank test was used for statistical analysis.

Results

Phantom Experiment

Figure 7:
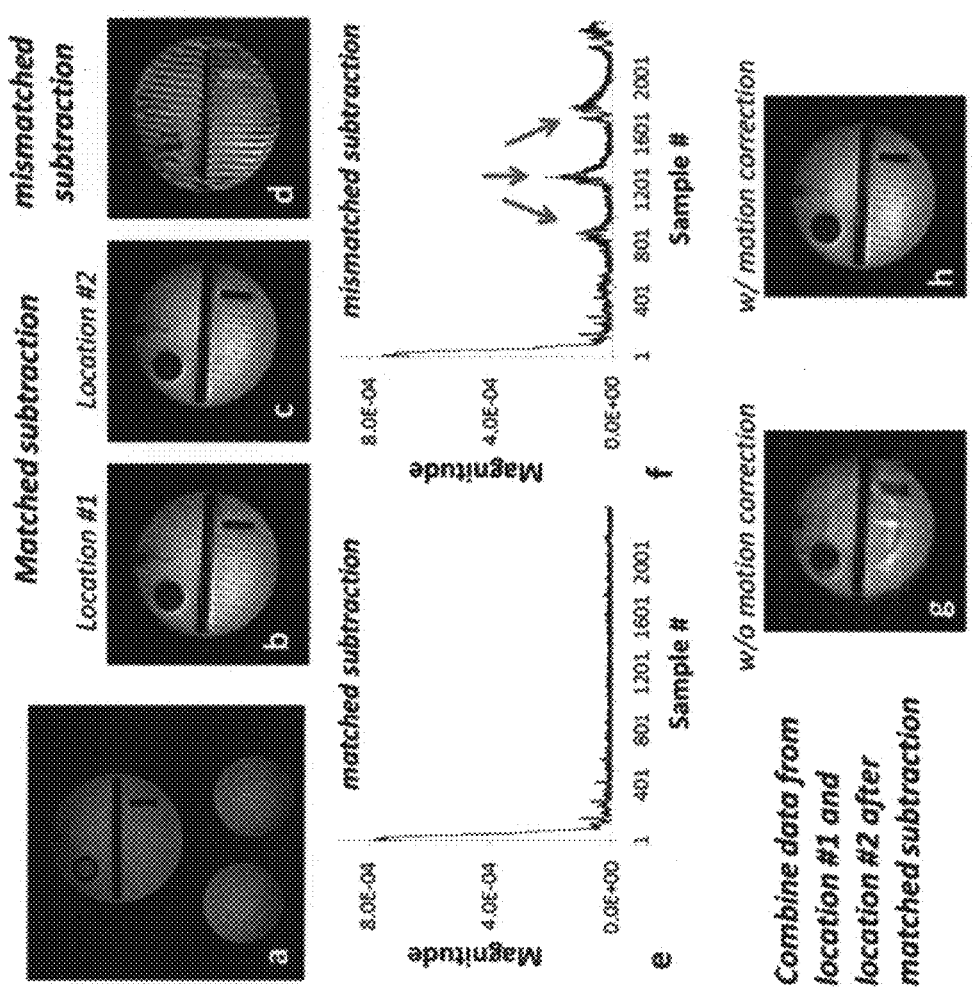
FIG. 7 illustrates results from applying a method for reducing artifacts in free-breathing cine DENSE on a phantom, in accordance with example embodiments.

Results of the phantom experiment are shown in FIG. 7. The imaging plane has three phantoms but only the large one is within the field-of-view of cine DENSE (a). With outer-volume-suppression, the DENSE images acquired at both locations are high quality and not aliased (b and c). However, image from subtraction of phase-cycled data with mismatched subtraction has strong striping artifacts (d) and the corresponding k-space data has strong residual T1 echo (f). When combining post-subtraction data from the two locations, the image reconstructed without motion correction has artifacts and is blurry (g), and motion compensation in k-space by phase correction eliminates these artifacts and blurriness (h).

The results demonstrated that (1) residual T1 energy per spiral interleaf pair is minimized when data are from matched locations, (2) post-subtraction iNAVs provide images with outer-volume-suppression and accurate motion estimation, and (3) motion correction reduces blurring when combining data from multiple locations.

PCA-Based Filtering on Pre-iNAVs

Figure 8:
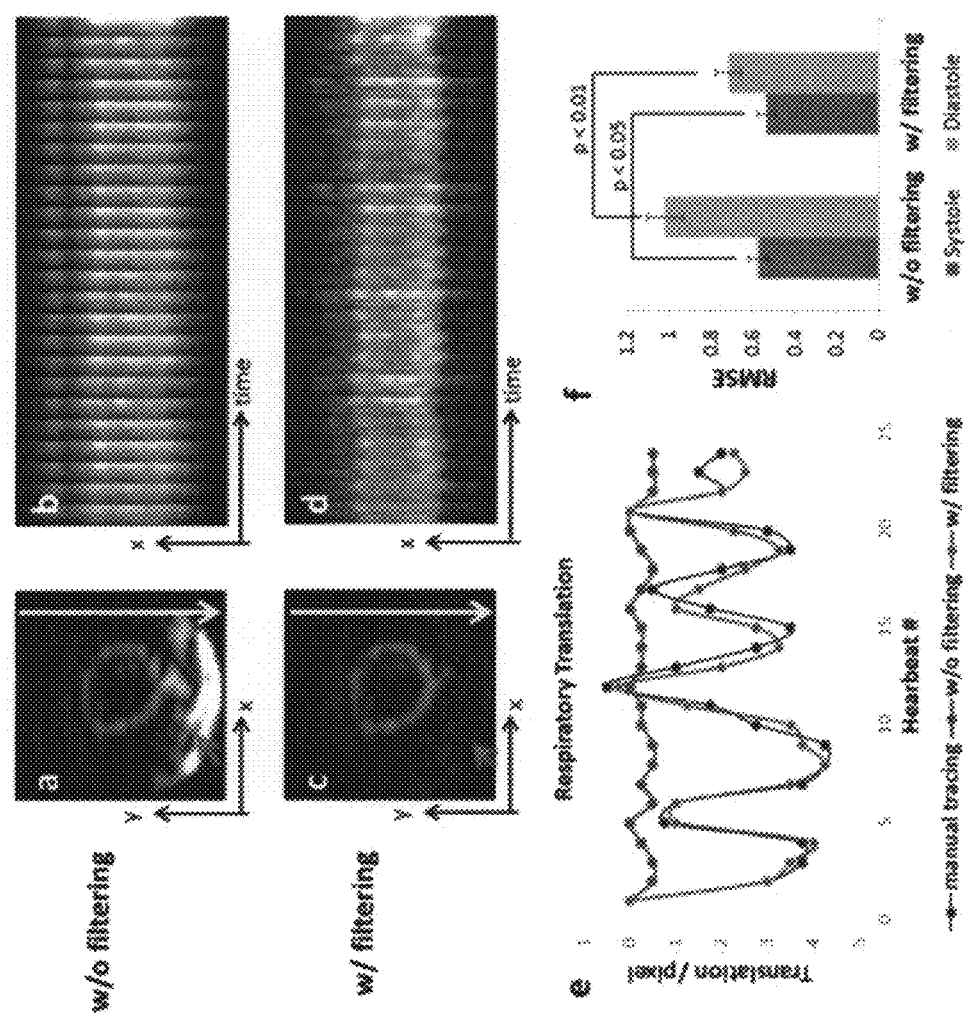
FIG. 8 illustrates example pre-iNAVs reconstructed with and without PCA-based filtering and the projection of the iNAVs in the x-direction and motion estimation accuracies, in accordance with example embodiments.

Example pre-iNAVs and evaluation of the PCA-based filtering are shown in FIG. 8. Without PCA-based filtering, the pre-iNAV image has a strong residual T1 relaxation signal outside the heart (predominantly fat signal from chest wall in this example) (FIG. 8 at (a) and (b), red arrow), while the pre-iNAV reconstructed with PCA-based filtering shows suppression of the signal outside the heart (FIG. 8 at (c) and (d)).

An example of respiratory-induced translations of the heart estimated from a set of diastolic iNAVs is shown in FIG. 8 at (e). Respiratory motion estimated from pre-iNAVs with PCA-based filtering closely matches manual tracking while the motion estimated from pre-iNAVs without PCA-based filtering is not accurate. FIG. 8 at (f) summarizes the RMSE of translation estimation for all subjects and shows that for both systolic and diastolic pre-iNAVs, the RMSE with PCA-based filtering is significantly lower than that without filtering (systole, 0.56+/−0.06 vs. 0.63+/−0.07, p<0.05; diastole, 0.71+/−0.09 vs. 1.02+/−0.12, p<0.05).

Cine DENSE Reconstruction

Figure 9:
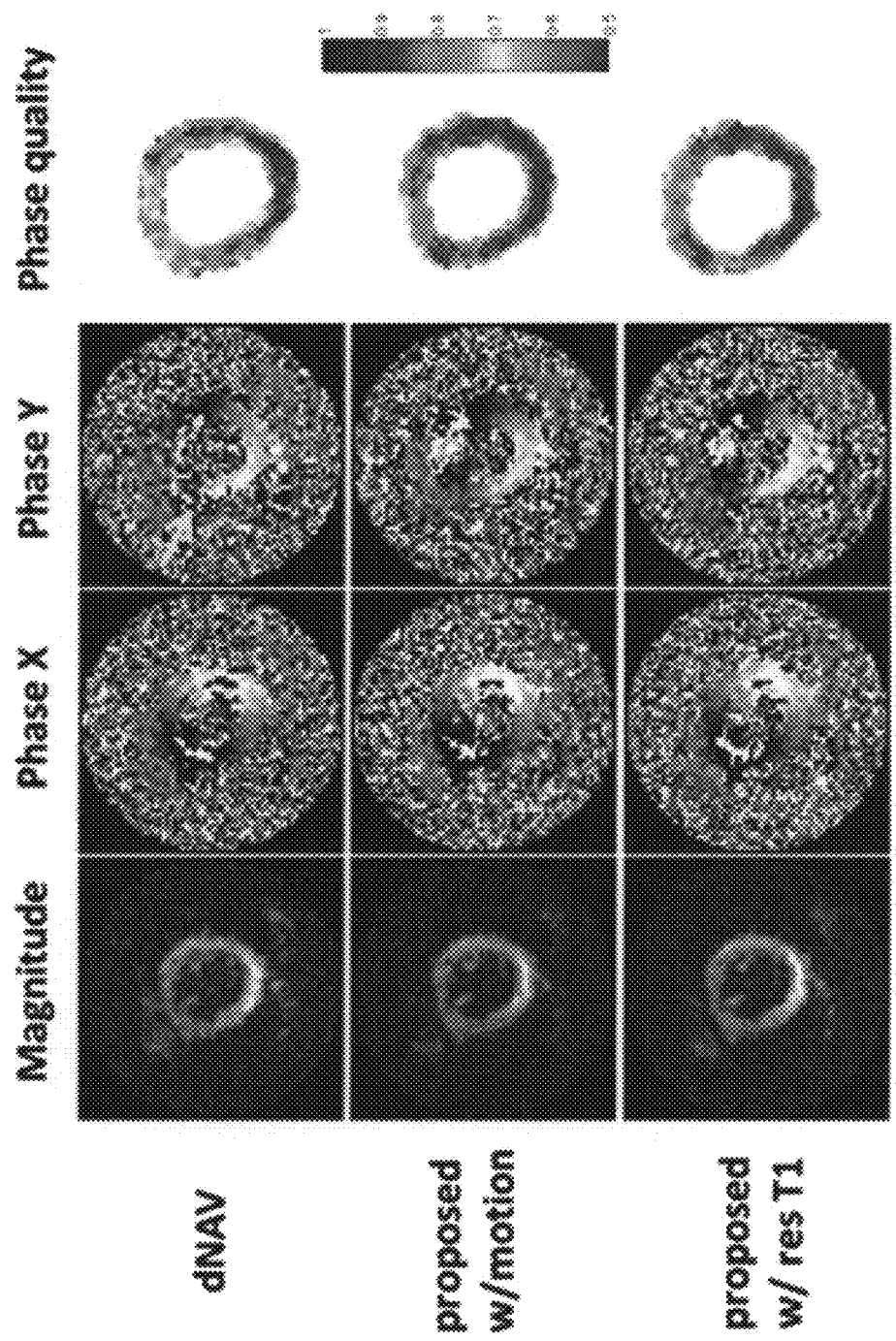
FIG. 9 shows a comparison of a method according to example embodiments or the present disclosure to the conventional dNAV method using a free-breathing dataset from a healthy subject.

FIG. 9 shows reconstructions of a free-breathing cine DENSE dataset using both the conventional dNAV method and a framework in accordance with embodiments of the present disclosure described above. A systolic frame is shown. The framework in accordance with the embodiment of the present disclosure with either motion or residual T1 energy criteria achieved higher image quality than conventional dNAV method, with higher signal-to-noise ratio in magnitude images and higher phase quality in phase images.

Figure 10A:
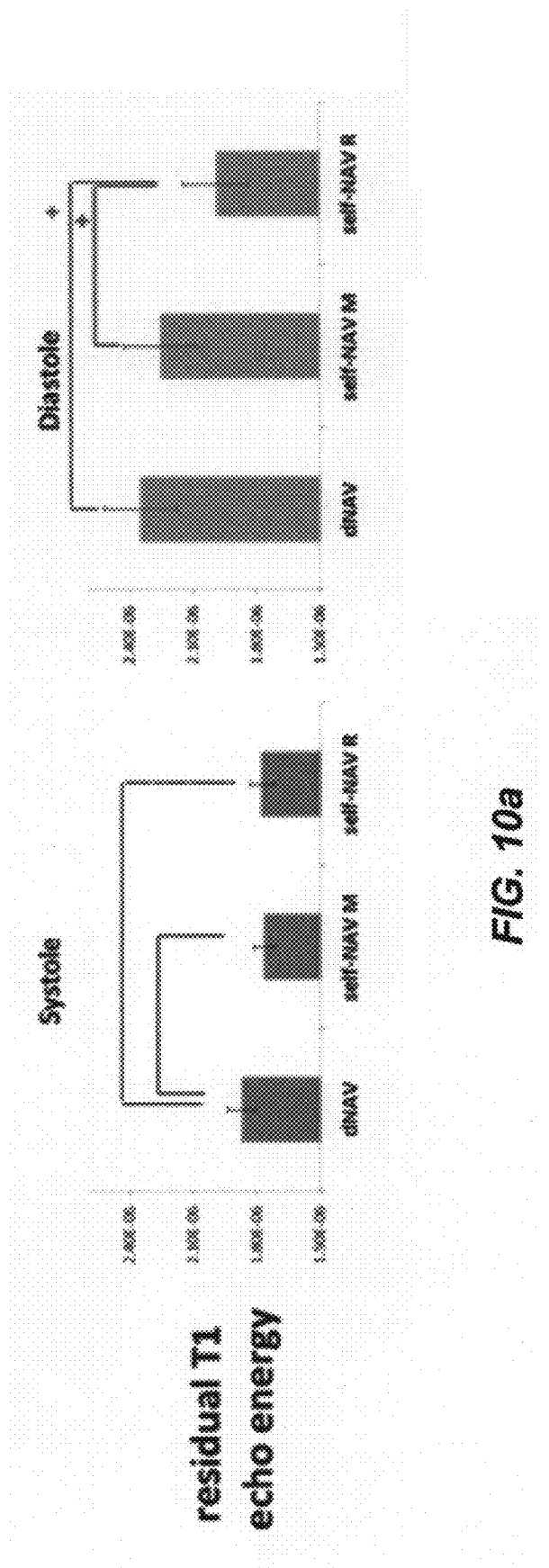
FIGS. 10a-10c show a summary of the quantitative evaluation of an algorithm according to example embodiments of the present disclosure compared to the conventional dNAV method.
Figure 10B:
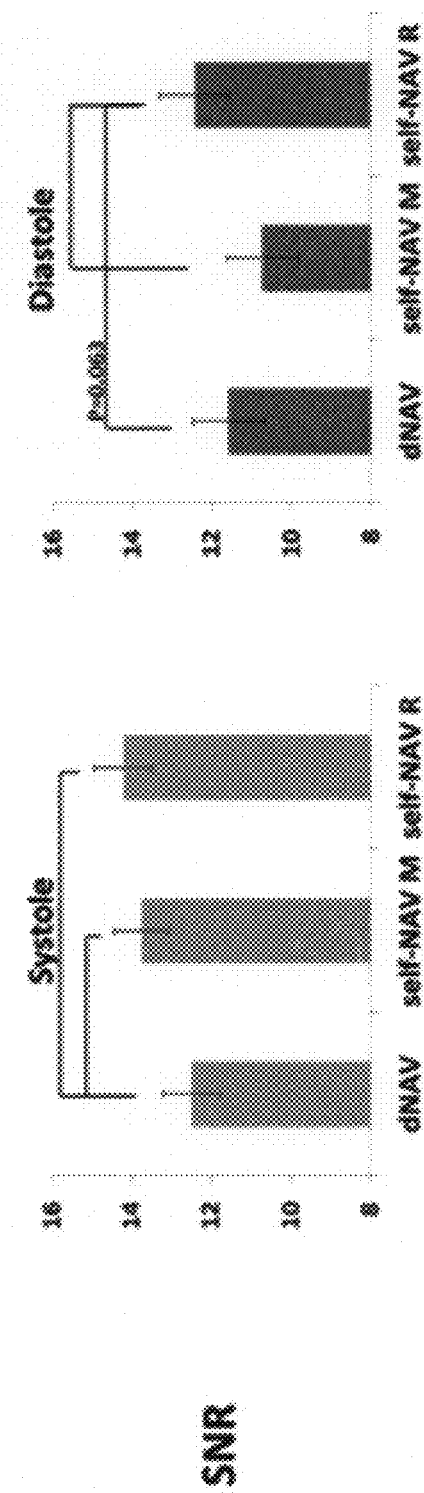
Figure 10C:
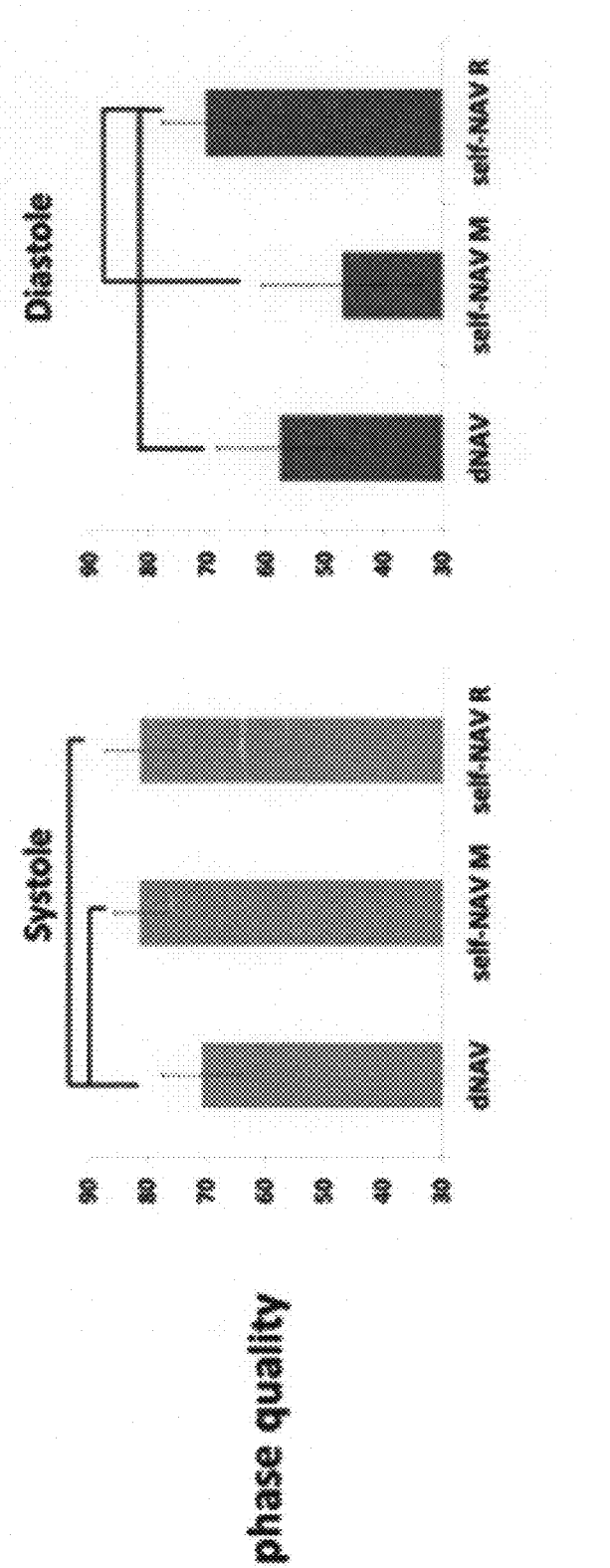

FIGS. 10*a*-10*c* show a summary of quantitative evaluation of image quality for each of residual T1 echo energy (FIG. 10*a*), SNR (FIG. 10*b*), and phase quality (FIG. 10*c*). For systolic frames, the framework with either criterion had significantly lower residual T1 echo energy, higher signal to noise ratio (SNR), and higher phase quality than dNAV method, demonstrating higher quality reconstruction of the using the framework according to embodiments of the present disclosure than the dNAV method. For diastolic frames, the framework with residual T1 energy criteria demonstrated significantly lower residual T1 echo energy, higher SNR and higher phase quality than dNAV method, and the residual T1 energy criteria also had lower residual T1 echo energy, higher SNR, and better phase quality than the motion-based criterion. These results together demonstrated that the framework with residual T1 echo energy achieved better image quality than dNAV and the proposed framework with motion criterion.

Residual T1 Echo Energy Versus Difference in dNAV Position

Figure 11:
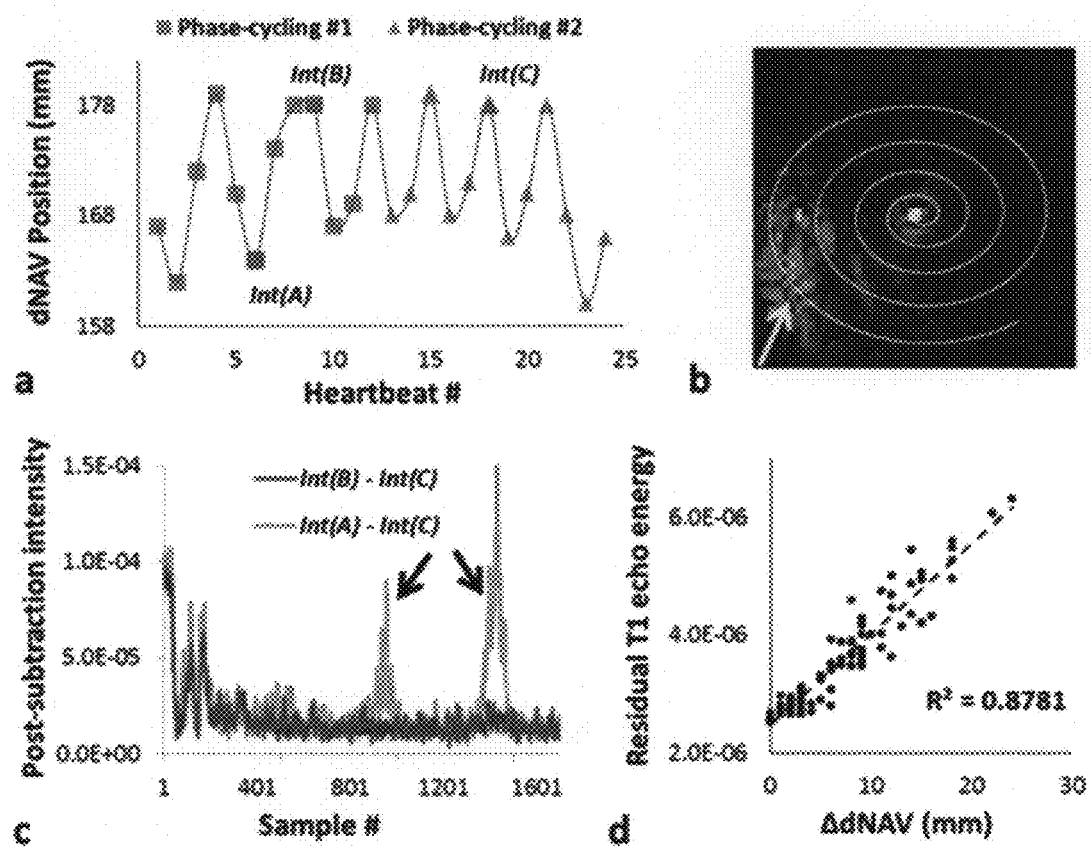
FIG. 11 shows an analysis of the relationship between residual T1 echo energy and difference in dNAV position, in accordance with example embodiments.

Correlation analysis between residual T1 echo energy and differences in dNAV position is shown in FIG. 11. The data in this example is from a 24-heartbeat free-breathing acquisition where the first 12 heartbeats are first phase-cycling dimension and the second 12 heartbeats are second phase-cycling (a). Int(B) and int(C) are an example phase-cycled data pair with matched respiratory position, subtraction of which suppresses the T1 relaxation echo well and thus has little residual T1 echo energy (blue plot in (c)). On the contrary, int(A) and int(C) are at very different respiratory positions, which correspond to large difference in dNAV position. Subtraction of int(A) and int(C) has poor suppression of the T1 echo and strong residual T1 echo energy in k-space (pink plot in panel c). The correlation between residual T1 echo energy and ΔdNAV of all possible phase-cycling pairs from (a) are shown in (d). Residual T1 echo energy is highly correlated with ΔdNAV with R-squared of 0.88. These results suggest that residual T1 echo energy after phase-cycling subtraction is a substitute for respiratory motion between the phase-cycled data.

Motion Estimation Using Post-iNAVs

Figure 12:
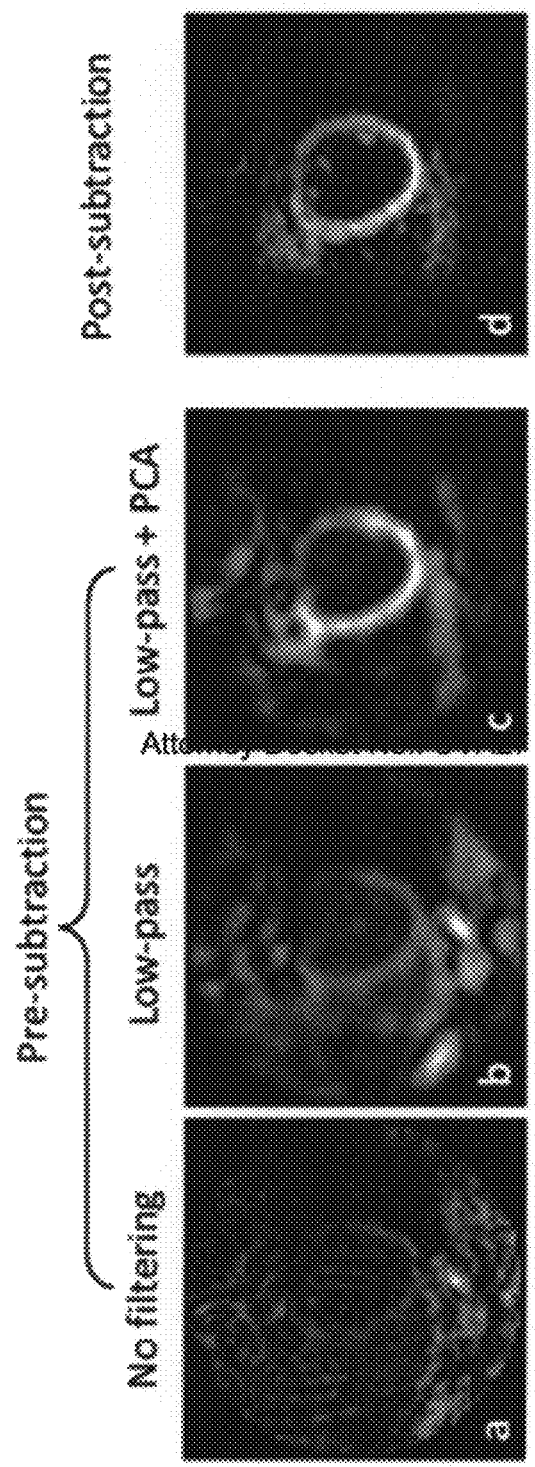
FIG. 12 shows a comparison of pre-subtraction and post-subtraction iNAVs at end diastole on a healthy subject, in accordance with example embodiments.

A comparison of pre-subtraction and post-subtraction iNAVs at late diastole is shown in FIG. 12. The pre-iNAV reconstructed without any filtering shows a low SNR and bad visualization of the myocardium due to a strong T1 relaxation echo. The low-pass filtered pre-iNAV is higher SNR and PCA filtering further removes the major T1 relaxation echo. However, there is still a strong signal other than the myocardium, which can reduce accuracy of motion estimation. On the other hand, the post-iNAV from data after subtraction of matched phase-cycling pairs shows high resolution and is not aliased by the T1 relaxation signal. These results demonstrated that subtraction of matched phase-cycling data pairs provides high quality iNAVs for automatic motion estimation.

Figure 13:
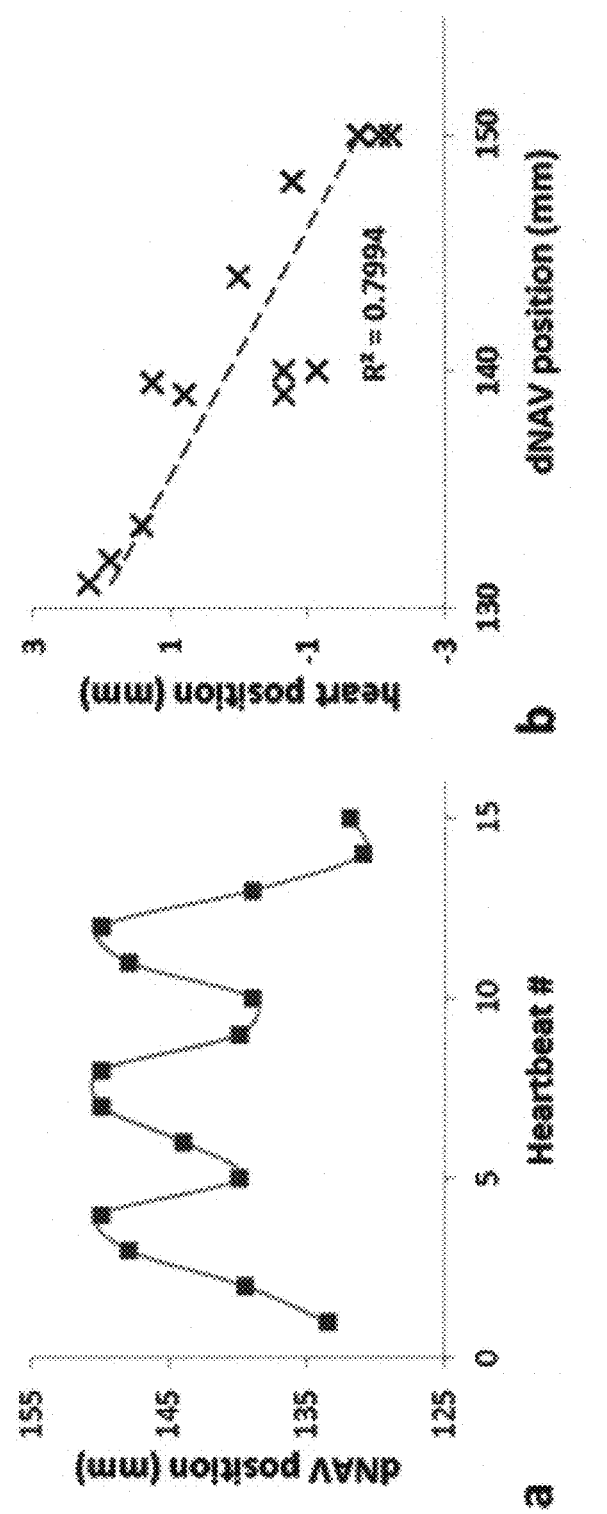
FIG. 13 shows respiratory motion estimated from post-iNAVs correlated with that from dNAV position using free-breathing data acquired with 15 averages, in accordance with example embodiments.

A comparison of motion tracked by dNAVs and estimated from post-iNAVs is shown in FIG. 13. The results are analyzed from a 15-average acquisition. FIG. 13 at (a) shows acquisition of first phase-cycling dimension over 15 heartbeats. For data of each heartbeat, the best match was identified by residual T1 echo criterion from the 15-average data of second phase-cycling. After phase-cycling subtraction, post-iNAVs were reconstructed. Heart position was estimated using cross-correlation from the post-iNAVs and compared to respiratory motion tracked by dNAV. The end-diastolic iNAV was used to best match timing of iNAV and dNAV within each heartbeat. As shown in panel b, the heart position from post-iNAV is highly correlated with dNAV position (R-squared=0.80).

Acceptance Window and Inter-Phase-Cycling Motion

Figure 14:
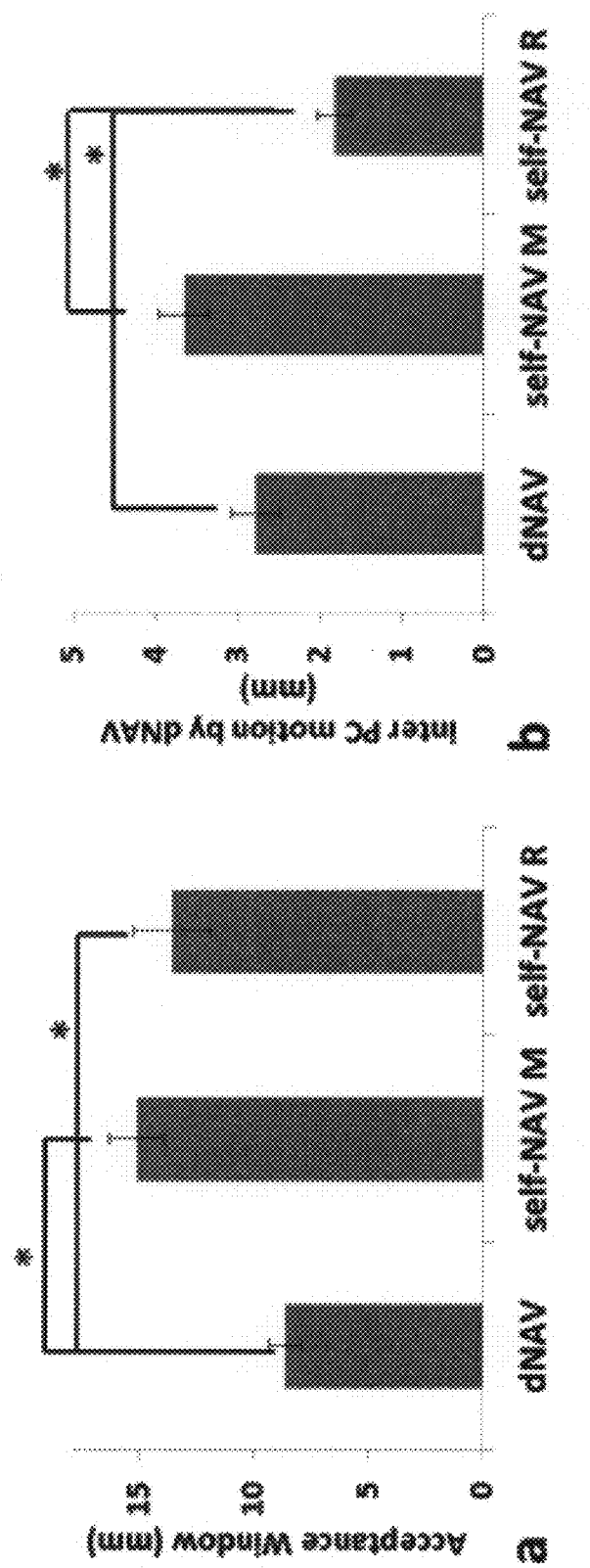
FIG. 14 illustrates an acceptance window and inter-phase-cycling motion calculated from dNAVs, in accordance with example embodiments.

FIG. 14 compares effective acceptance window, defined as range of dNAV position of all accepted data, and inter-phase-cycling motion, defined as the difference in dNAV position of each phase-cycling pair, of all three reconstructions. The effective acceptance window of the proposed framework is significantly larger than that of dNAV method ($p<0.05$, paired t-test), suggesting that the framework in accordance with embodiments of the present disclosure accept data from a wider range of respiratory status. The inter-phase-cycling motion of the framework with residual T1 echo is significantly lower than that of dNAV and the framework with motion-based criterion. These results demonstrate that the residual T1 echo criterion identifies phase-cycled data with smaller motion than dNAV method and the motion-based criterion.

Discussion

A framework for free-breathing cine DENSE imaging that optimizes cancellation of T1 relaxation echo through a match-making process and compensates for respiratory motion after phase-cycling subtraction using image-based motion estimation and k-space correction was developed and evaluated. The phantom experiment demonstrated the concepts of the framework and evaluation in healthy subjects demonstrated the advantages of this framework over conventional dNAV methods. This study also evaluated two different criteria for match-making and demonstrated that residual T1 echo energy is a substitute for motion and has advantages over dNAV and motion-based criterion.

In accordance with some embodiments, the proposed framework prioritizes matching of phase-cycling data pairs for each spiral interleaf, as opposed to accepting data to be within a narrow diaphragm acceptance window, and that the former is a more effective strategy for free-breathing cine DENSE imaging. This approach recognizes the importance of suppressing the T1 relaxation echo, which uniquely is a major source of artifacts for cine DENSE. The results showed that, in systole, residual T1 echo energy, SNR, and phase quality are all improved when using the match-making methods with motion correction compared to conventional dNAV method.

The phantom experiment demonstrated the concepts of the framework, including that that residual T1 echo energy is minimized when phase-cycled data are acquired from matched locations and motion correction reduces artifacts when combining data acquired when object is at different locations. These findings apply to in-plane motion, but will be limited for 2D imaging when there is through-plane motion.

Match-making using residual T1 echo energy performed better than a conventional iNAV approach, even after applying PCA to remove the T1 relaxation echo from pre-iNAVs. The match-making method based on minimizing residual T1 echo energy was found to select phase-cycling pairs with the lowest inter-pair difference in diaphragm position. Residual T1 echo energy can be advantageous as it is computationally efficient as it can be calculated directly in k-space without reconstruction intermediate images or motion registration.

The residual T1 echo energy is a simple and effective match-making criterion, is a substitute for the difference in dNAV position of phase-cycled data pairs, and has advantages compared to dNAV. Thus, choosing spiral interleaf phase-cycling pairs with minimal residual T1 energy is a substitute for choosing spiral interleaf phase-cycling pairs at matched respiratory positions. Accordingly, subtraction of matched spiral interleaves with complementary phase cycling values yields excellent suppression of T1-relaxation echoes, effective outer volume suppression and high-quality post-iNAVs. These high-quality iNAVs have a reduced field-of-view that is focused on the heart and are well-suited for automatic estimation of rigid-body motion and subsequent motion compensation when combining data from various positions in the respiratory cycle. Ideally, if the respiratory motion can be accurately tracked using dNAV at multiple time points within a heart cycle, the matching process can also be done by minimizing difference in dNAV between the phase-cycled data. However, the dNAV method still has disadvantages. First, acquisition time of a dNAV is about 20 ms and therefore cannot be applied often in a heart cycle. Second, dNAV measures position of the diaphragm instead of directly tracking position of the heart. On the other hand, the framework using residual T1 echo energy is self-navigated, does not need extra acquisition, and tracks motion of the heart using the imaging dataset itself.

Use of the T1 relaxation echo for motion tracking can be extended to other stimulated echo MR imaging methods, such as diffusion-weighted STEAM MRI, by acquiring T1 relaxation echo before application of the decoding gradient. It could also be done with a separate acquisition.

Using outer-volume-suppression of cine DENSE is another key of the framework in accordance with embodiments of the present disclosure, and it benefits the framework in three ways. First, using outer-volume-suppression, stimulated echo can be localized to the heart region, which facilitates automated motion estimation with localized stimulated echo post-iNAVs. Second, outer-volume-suppression only restricts stimulated echo to the heart region but not the T1 relaxation echo. Therefore, the amplitude of the stimulated echo is amplified by outer-volume-suppression, which increases the sensitivity of residual T1 relaxation echo energy to motion. Third, outer-volume-suppression itself offers accelerated imaging, and the current framework can be potentially combined with advanced reconstruction methods such as parallel imaging and compressed sensing to further reduce imaging time of free-breathing cine DENSE.

The evaluation of the framework was done with data acquired with simple encoding where the first encoding dimension is for background phase estimation and does not have in-plane displacement encoding. Therefore, the T1 relaxation echo does not center at different location from stimulated echoes. One may argue that for this encoding dimension, residual T1 echo energy is less sensitive to respiratory motion between phase-cycled data. A potential solution to address this issue is to use balanced encoding ([22]) to guarantee separation of the T1 relaxation echo and stimulated echo in k-space for all encoding dimensions.

In this study, all datasets were acquired with four averages and reconstructed offline with the same efficiency. However, this acquisition protocol can be further improved to enable adaptive acquisition so that good cancellation of T1 relaxation echo is achieved for all trajectories. An adaptive acquisition strategy would also potentially improve the imaging efficiency.

Overall, aspects of the present disclosure provide a novel and better solutions to address the artifact sources, as well as a basis framework for further development of free-breathing imaging.

CONCLUSION

The specific configurations, choice of materials and the size and shape of various elements can be varied according to particular design specifications or constraints requiring a system or method constructed according to the principles of the present disclosure. Such changes are intended to be embraced within the scope of the present disclosure. The presently disclosed embodiments, therefore, are considered in all respects to be illustrative and not restrictive. The patentable scope of certain embodiments of the present disclosure is indicated by the appended claims, rather than the foregoing description, and all changes that come within the meaning and range of equivalents thereof are intended to be embraced therein.

REFERENCE LIST

[1] Florescu M, Cinteza M, Vinereanu D. Chemotherapy-induced cardiotoxicity. Maedica (Buchar). 2013; 8(1):59-67.

[2] Auger D A, Bilchick K C, Gonzalez J A, Cui S X, Holmes J W, Kramer C M, et al. Imaging left-ventricular mechanical activation in heart failure patients using cine DENSE MRI: Validation and implications for cardiac resynchronization therapy. Journal of Magnetic Resonance Imaging. 2017.

[3] Thavendiranathan P, Poulin F, Lim K-D, Plana J C, Woo A, Marwick T H. Use of myocardial strain imaging by echocardiography for the early detection of cardiotoxicity in patients during and after cancer chemotherapy: a systematic review. Journal of the American College of Cardiology. 2014; 63(25):2751-68.

[4] Prinzen F W, Hunter W C, Wyman B T, McVeigh E R. Mapping of regional myocardial strain and work during ventricular pacing: experimental study using magnetic resonance imaging tagging. Journal of the American College of Cardiology. 1999; 33(6):1735-42.

[5] Daniel Kim W D G, Christopher M. Kramer, and Frederick H. Epstein. Myocardial Tissue Tracking with Two-dimensional Cine Displacement-encoded M R Imaging: Development and Initial Evaluation. Radiology. 2004; 230(3):862-71.

[6] Spottiswoode B S, Zhong X, Hess A, Kramer C, Meintjes E M, Mayosi B M, et al. Tracking myocardial motion from cine DENSE images using spatiotemporal phase unwrapping and temporal fitting. Medical Imaging, IEEE Transactions on. 2007; 26(1):15-30.

[7] van Heeswijk R B, Bonanno G, Coppo S, Coristine A, Kober T, Stuber M. Motion compensation strategies in magnetic resonance imaging. Critical Reviews™ in Biomedical Engineering. 2012; 40(2).

[8] Epstein F H, Gilson W D. Displacement-encoded cardiac MRI using cosine and sine modulation to eliminate (CANSEL) artifact-generating echoes. Magnetic resonance in medicine. 2004; 52(4):774-81.

[9] Zhong X, Spottiswoode B S, Meyer C H, Kramer C M, Epstein F H. Imaging three-dimensional myocardial mechanics using navigator-gated volumetric spiral cine DENSE MRI. Magnetic Resonance in Medicine. 2010; 64(4):1089-97.

[10] Hamlet S M, Haggerty C M, Suever J D, Wehner G J, Andres K N, Powell D K, et al. Optimal configuration of respiratory navigator gating for the quantification of left ventricular strain using spiral cine displacement encoding with stimulated echoes (DENSE) MRI. Journal of Magnetic Resonance Imaging. 2016.

[11] Pang J, Bhat H, Sharif B, Fan Z, Thomson L E, LaBounty T, et al. Whole-heart coronary MRA with 100% respiratory gating efficiency: Self-navigated three-dimensional retrospective image-based motion correction (TRIM). Magnetic Resonance in Medicine. 2014; 71(1):67-74.

[12] Usman M, Atkinson D, Odille F, Kolbitsch C, Vaillant G, Schaeffter T, et al. Motion corrected compressed sensing for free-breathing dynamic cardiac MRI. Magnetic resonance in medicine: official journal of the Society of Magnetic Resonance in Medicine/Society of Magnetic Resonance in Medicine. 2013; 70(2):504-16.

[13] Moghari M H, Komarlu R, Annese D, Geva T, Powell A J. Free-breathing steady-state free precession cine cardiac magnetic resonance with respiratory navigator gating. Magnetic Resonance in Medicine. 2015; 73(4):1555-61.

[14] Stehning C, Bornert P, Nehrke K, Eggers H, Stuber M. Free-breathing whole-heart coronary MRA with 3D radial SSFP and self-navigated image reconstruction. Magnetic resonance in medicine. 2005; 54(2):476-80.

[15] Larson A C, White R D, Laub G, McVeigh E R, Li D, Simonetti O P. Self-gated cardiac cine MRI. Magnetic Resonance in Medicine. 2004; 51(1):93-102.

[16] Pan L, Stuber M, Kraitchman D L, Fritzges D L, Gilson W D, Osman N F. Real-time imaging of regional myocardial function using fast-SENC. Magnetic Resonance in Medicine. 2006; 55(2):386-95. [17] Pan L, Stuber M, Kraitchman D L, Fritzges D L, Gilson W D, Osman N F. Real-time imaging of regional myocardial function using fast-SENC. Magnetic Resonance in Medicine. 2006; 55(2):386-95.

[17] Abd-Elmoniem, Khaled Z., Christoph Barmet, and Matthias Stuber. "Free-breathing inner-volume black-blood imaging of the human heart using two-dimensionally selective local excitation at 3 T." Magnetic resonance in medicine 68.3 (2012): 822-829.

[18] Tustison N J, Avants B B. Diffeomorphic directly manipulated free-form deformation image registration via vector field flows. Biomedical Image Registration: Springer; 2012. p. 31-9.

[19] Fessler J, Sutton B P. Nonuniform fast Fourier transforms using min-max interpolation. Signal Processing, IEEE Transactions on. 2003; 51(2):560-74.

[20] Shechter G, McVeigh E R, editors. M R motion correction of 3D affine deformations. Proceedings Int Soc Mag Reson Med; 2003: Citeseer.

[21] Osman N F, Kerwin W S, McVeigh E R, Prince J L. Cardiac motion tracking using CINE harmonic phase (HARP) magnetic resonance imaging. Magnetic resonance in medicine: official journal of the Society of Magnetic Resonance in Medicine/Society of Magnetic Resonance in Medicine. 1999; 42(6):1048.

[22] Zhong X, Helm P A, Epstein F H. Balanced multipoint displacement encoding for DENSE MRI. Magnetic resonance in medicine. 2009; 61(4):981-8.

The invention claimed is:

1. A method comprising:
acquiring magnetic resonance data for an area of interest of a subject, wherein the acquiring comprises performing sampling with phase-cycled, cine displacement encoding with stimulated echoes (DENSE) during free-breathing of the subject;
identifying, from the acquired magnetic resonance data, a plurality of phase-cycling data pairs corresponding to matched respiratory phases of the free-breathing of the subject;
reconstructing, from the plurality of phase-cycling data pairs, a plurality of intermediate self-navigation images of the area of interest of the subject;
performing motion correction by estimating, from the plurality of intermediate self-navigation images, the respiratory position associated with the plurality of phase-cycling data pairs; and
reconstructing a plurality of motion-corrected cine DENSE images of the area of interest of the subject.

2. The method of claim 1, wherein identifying the plurality of phase-cycling data pairs corresponding to matched respiratory phases includes determining whether a plurality of phase-cycling data meet match-making criterion associated with respiratory motion of the subject.

3. The method of claim 2, wherein the match-making criterion includes a residual T1 relaxation echo energy determined by subtracting the plurality of phase-cycling data to identify phase-cycling data pairs at matched respiratory phases.

4. The method of claim 3, wherein phase-cycling data at matched respiratory phases have a lower residual T1 relaxation echo energy than phase-cycling data at different respiratory phases.

5. The method of claim 1, wherein identifying the plurality of phase-cycling data pairs corresponding to matched respiratory phases comprises reconstructing a plurality of pre-subtraction intermediate self-navigation images.

6. The method of claim 5, further comprising performing principal component analysis (PCA)-based filtering to suppress a T1 relaxation echo.

7. The method of claim 5, further comprising performing motion estimation between a plurality of pre-subtraction intermediate self-navigation images to identify a plurality of phase-cycling data pairs corresponding to matched respiratory phases.

8. The method of claim 1, wherein performing motion correction by estimating, from the plurality of intermediate self-navigation images, the respiratory position associated with the plurality of phase-cycling data pairs includes using slice-selective radiofrequency pulses such that the stimulated echo generates a signal from a region focused on the area of interest of the subject.

9. A system comprising:
a data acquisition device configured to acquire magnetic resonance data for an area of interest of a subject, wherein the acquiring comprises performing sampling with phase-cycled, cine displacement encoding with stimulated echoes (DENSE) during free-breathing of the subject;
one or more processors coupled to the data acquisition device and configured to cause the system to perform functions including:
identifying, from the acquired magnetic resonance data, a plurality of phase-cycling data pairs corresponding to matched respiratory phases of the free-breathing of the subject;
reconstructing, from the plurality of phase-cycling data pairs, a plurality of intermediate self-navigation images of the area of interest of the subject;
performing motion correction by estimating, from the plurality of intermediate self-navigation images, the respiratory position associated with the plurality of phase-cycling data pairs; and
reconstructing a plurality of motion-corrected cine DENSE images of the area of interest of the subject.

10. The system of claim 9, wherein the data acquisition device comprises a magnetic resonance imaging (MRI) device.

11. The system of claim 9, wherein identifying the plurality of phase-cycling data pairs corresponding to matched respiratory phases includes determining whether a plurality of phase-cycling data meet match-making criterion associated with respiratory motion of the subject.

12. The system of claim 11, wherein the match-making criterion includes a residual T1 relaxation echo energy determined by subtracting the plurality of phase-cycling data to identify phase-cycling data pairs at matched respiratory phases.

13. The system of claim 12, wherein phase-cycling data at matched respiratory phases have a lower residual T1-relaxation echo energy than phase-cycling data at different respiratory phases.

14. The system of claim 9, wherein identifying the plurality of phase-cycling data pairs corresponding to matched respiratory phases comprises reconstructing a plurality of pre-subtraction intermediate self-navigation images.

15. The system of claim 14, wherein the one or more processors are configured to cause the system to perform further functions that comprise performing principal component analysis (PCA)-based filtering to suppress a T1 relaxation echo.

16. The system of claim 14, wherein the one or more processors are configured to cause the system to perform further functions that comprise performing motion estimation between a plurality of pre-subtraction intermediate self-navigation images to identify a plurality of phase-cycling data pairs corresponding to matched respiratory phases.

17. The system of claim 9, wherein performing motion correction by estimating, from the plurality of intermediate self-navigation images, the respiratory position associated with the plurality of phase-cycling data pairs includes using slice-selective radiofrequency pulses such that the stimulated echo generates a signal from a region focused on the area of interest of the subject.

18. A non-transitory computer-readable medium having stored instructions that, when executed by one or more processors, cause one or more computing devices to perform functions that comprise:
acquiring magnetic resonance data for an area of interest of a subject, wherein the acquiring comprises performing sampling with phase-cycled, cine displacement encoding with stimulated echoes (DENSE) during free-breathing of the subject;
identifying, from the acquired magnetic resonance data, a plurality of phase-cycling data pairs corresponding to matched respiratory phases of the free-breathing of the subject;
reconstructing, from the plurality of phase-cycling data pairs, a plurality of intermediate self-navigation images of the area of interest of the subject;
performing motion correction by estimating, from the plurality of intermediate self-navigation images, the respiratory position associated with the plurality of phase-cycling data pairs; and
reconstructing a plurality of motion-corrected cine DENSE images of the area of interest of the subject.

19. The non-transitory computer-readable medium of claim 18, wherein identifying the plurality of phase-cycling data pairs corresponding to matched respiratory phases includes determining whether a plurality of phase-cycling data meet match-making criterion associated with respiratory motion of the subject.

20. The non-transitory computer-readable medium of claim 19, wherein the match-making criterion includes a residual T1 relaxation echo energy determined by subtracting the plurality of phase-cycling data to identify phase-cycling data pairs at matched respiratory phases.

21. The non-transitory computer-readable medium of claim 20, wherein phase-cycling data at matched respiratory phases have a lower residual T1-relaxation echo energy than phase-cycling data at different respiratory phases.

22. The non-transitory computer-readable medium of claim 18, wherein identifying the plurality of phase-cycling data pairs corresponding to matched respiratory phases comprises reconstructing a plurality of pre-subtraction intermediate self-navigation images.

23. The non-transitory computer-readable medium of claim 22, wherein the instructions, when executed by the one or more processors, cause the one or more computing devices to perform further functions that comprise performing principal component analysis (PCA)-based filtering to suppress a T1 relaxation echo.

24. The non-transitory computer-readable medium of claim 22, wherein the instructions, when executed by the one or more processors, cause the one or more computing devices to perform further functions that comprise performing motion estimation between a plurality of pre-subtraction intermediate self-navigation images to identify a plurality of phase-cycling data pairs corresponding to matched respiratory phases.

25. The non-transitory computer-readable medium of claim 18, wherein performing motion correction by estimating, from the plurality of intermediate self-navigation images, the respiratory position associated with the plurality of phase-cycling data pairs includes using slice-selective radiofrequency pulses such that the stimulated echo generates a signal from a region focused on the area of interest of the subject.

* * * * *